United States Patent
Nagode et al.

(10) Patent No.: US 9,531,410 B2
(45) Date of Patent: Dec. 27, 2016

(54) METHOD FOR ENVELOPE TRACKING MULTIPLE TRANSMISSIONS THROUGH A SINGLE POWER AMPLIFIER

(71) Applicant: Google Technology Holdings LLC, Mountain View, CA (US)

(72) Inventors: Thomas D. Nagode, Vernon Hills, IL (US); Gregory R Black, Vernon Hills, IL (US); Dale G. Schwent, Schaumburg, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 77 days.

(21) Appl. No.: 14/101,380

(22) Filed: Dec. 10, 2013

(65) Prior Publication Data

US 2014/0269986 A1 Sep. 18, 2014

Related U.S. Application Data

(60) Provisional application No. 61/788,695, filed on Mar. 15, 2013.

(51) Int. Cl.
  *H04B 1/04* (2006.01)
  *H03F 1/02* (2006.01)

(52) U.S. Cl.
  CPC .......... *H04B 1/0475* (2013.01); *H03F 1/0222* (2013.01)

(58) Field of Classification Search
  CPC ............................ H04B 1/0475; H03F 1/0222
  USPC .................................................. 375/295–297
  See application file for complete search history.

(56) References Cited

U.S. PATENT DOCUMENTS

| 6,181,674 | B1 | 1/2001 | Xin et al. |
| 7,408,901 | B1 | 8/2008 | Narayanabhatla |
| 7,474,642 | B1 | 1/2009 | Chheda |
| 2011/0182197 | A1* | 7/2011 | Jones et al. .................... 370/252 |
| 2012/0170624 | A1* | 7/2012 | Rozenblit et al. ............. 375/219 |

FOREIGN PATENT DOCUMENTS

| EP | 2442440 A1 | 4/2012 |
| GB | 2488119 A | 8/2012 |
| WO | WO00/08774 A1 | 2/2000 |
| WO | WO03/081793 A1 | 10/2003 |

OTHER PUBLICATIONS

International Preliminary Report on Patentability issued by The International Bureau of WIPO, Geneva, Switzerland, dated Sep. 24, 2015 for International Application No. PCT/US2014/018536; 9 pages.

* cited by examiner

*Primary Examiner* — Kevin M Burd
(74) *Attorney, Agent, or Firm* — Faegre Baker Daniels LLP

(57) ABSTRACT

In one example, a method is performed on an integrated circuit, for generating a composite envelope reference voltage for a plurality of transmit signals. The method includes, generating a composite baseband signal from a plurality of baseband signals, wherein the plurality of baseband signals represent a corresponding plurality of different transmit signals. The method also includes calculating a composite envelope signal for the composite baseband signal, and generating a composite envelope reference voltage from the composite envelope signal for use in powering a single power amplifier as the power amplifier transmits the plurality of different transmit signals.

12 Claims, 20 Drawing Sheets

METHOD FOR ENVELOPE TRACKING MULTIPLE TRANSMISSIONS THROUGH A SINGLE POWER AMPLIFIER

RELATED APPLICATIONS

This application is a non-provisional application of commonly assigned U.S. Provisional Patent Application No. 61/788,695, filed on Mar. 15, 2013, from which benefits under 35 USC §119(e) are hereby claimed and the contents of which are hereby incorporated by reference herein.

FIELD OF THE DISCLOSURE

The present disclosure relates generally to envelope tracking in communication devices and more particularly to envelope tracking of multiple transmit signals through a power amplifier.

BACKGROUND

Next generation wireless systems use a wideband technology that allows for simultaneously transmitting multiple transmit signals, corresponding to different baseband signals, to one or more base stations over a plurality of channels. In some mobile communication devices, this requires transmitting the multiple transmit signals using a single power amplifier. Envelope tracking technology exists to enable the power amplifier to more efficiently transmit a single radio frequency (RF) transmit signal. This efficiency is had by generating a power supply voltage to the power amplifier that tracks the envelope of the single transmit signal. However, the current envelope tracking schemes prove insufficient where a single power amplifier is used to transmit multiple transmit signals.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
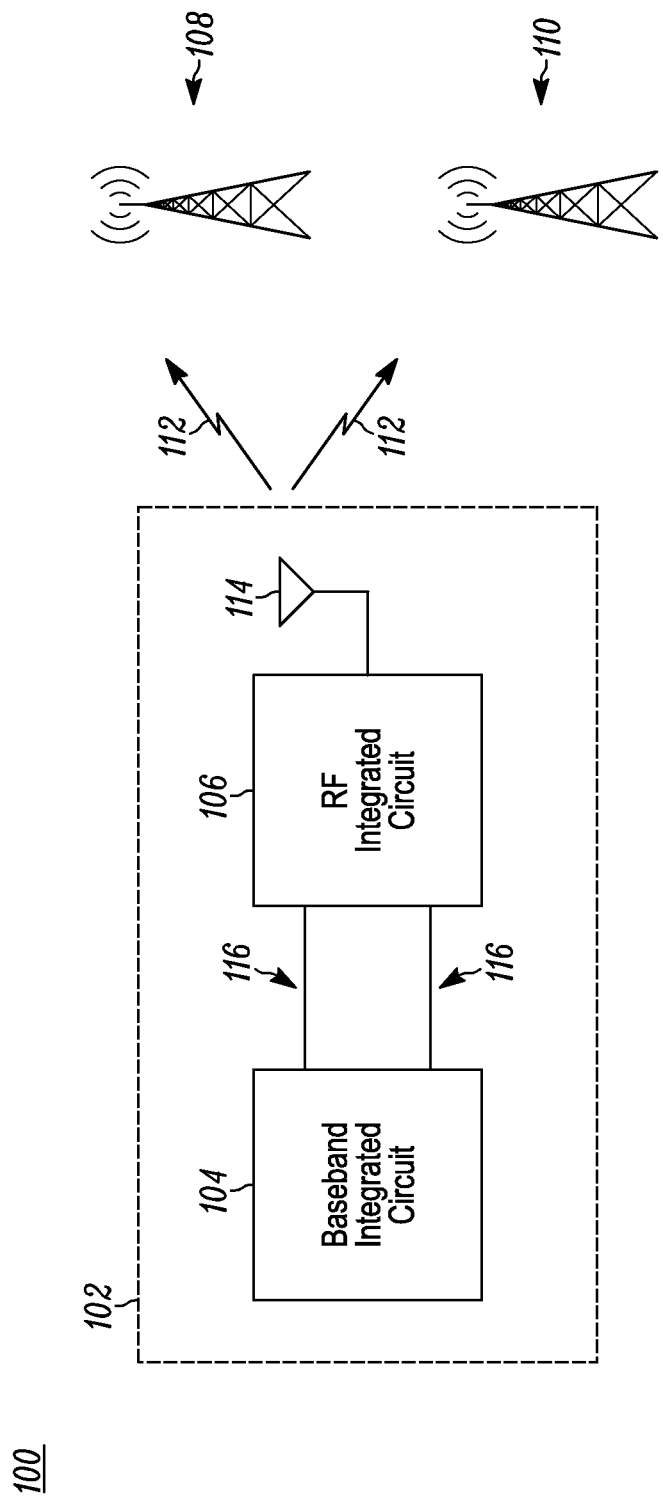
FIG. 1 is a block diagram illustrating one example of a wireless network in which embodiments of the present teaching operate.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. In addition, the description and drawings do not necessarily require the order illustrated. It will be further appreciated that certain actions and/or steps may be described or depicted in a particular order of occurrence while those skilled in the art will understand that such specificity with respect to sequence is not actually required.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Generally speaking, pursuant to the various embodiments, the present disclosure provides a method and apparatus for generating a composite envelope reference voltage for a plurality of transmit signals. The method comprises: generating a composite baseband signal from a plurality of baseband signals, wherein the plurality of baseband signals represent a corresponding plurality of different transmit signals. The method further includes: calculating a composite envelope signal for the composite baseband signal; and generating a composite envelope reference voltage from the composite envelope signal for use in powering a single power amplifier as the power amplifier transmits the plurality of different transmit signals. Driving the power amplifier using a composite envelope reference voltage derived from the composite envelope signal for the multiple transmit signals enables the power amplifier to simultaneously transmit the multiple transmit signals over different carrier frequencies with improved efficiency and reduced power consumption.

Referring to the drawings, and in particular to FIG. 1, a system implementing embodiments in accordance with the present teaching is shown and indicated generally at 100. The system 100 includes, in one example: a wireless communication device 102 that includes a baseband integrated circuit (IC) 104, a radio frequency integrated circuit (RFIC) 106, and an antenna 114; and base stations 108, 110.

In one embodiment, the baseband integrated circuit 104 is configured to manage a number of functions to assist the communication device 102 in participating in communication sessions with other wired or wireless devices (not shown) through transmitting and/or receiving, over one or more channels, signals carrying information. In one example, the baseband IC 104 is configured to provide one or more baseband signals to the RFIC 106 using signal lines 116. The RFIC 106 uses each baseband signal to modulate a higher frequency carrier signal to generate a corresponding radio frequency signal 112, each also referred to herein as a transmit signal. The communication device 102 transmits the one or more RF signals 112 to one or both of the base stations 108, 110 using the antenna 114.

In some instances, the communication device 102 simultaneously transmits information within multiple RF signals 112 over multiple channels using a single power amplifier. The present teachings, as described by reference to the remaining figures, illustrate embodiments for determining a composite envelope signal corresponding to multiple transmit signals and to generate, therefrom, a composite envelope reference voltage used to efficiently power or drive the single power amplifier as it transmits the multiple transmit signals.

As used herein, a transmit signal is information that will be transmitted as an RF signal by a power amplifier and antenna and is characterized by a corresponding baseband signal. The baseband signal is a signal used to modulate a carrier wave and is defined by an in-phase (I) component and a quadrature (Q) component. The I component is a zero phase cosine component, and the Q component is a phase $\Pi/2$ sine component. Signals having different I and/or Q components are considered as different transmit signals. A channel is a logical representation of a path over which a transmit signal is sent from one device to another device and is characterized by physical resources within a communication system as identified by at least one of a carrier frequency and/or channel identifier.

Where the single power amplifier is used to transmit multiple transmit signals, the multiple transmit signals can have corresponding baseband signals that are correlated or uncorrelated. Correlated baseband signals are signals in which the phase of the signals has a zero or constant offset versus time. Uncorrelated baseband signals are signals in which the phase of the two signals has a varying offset versus time.

Figure 2:
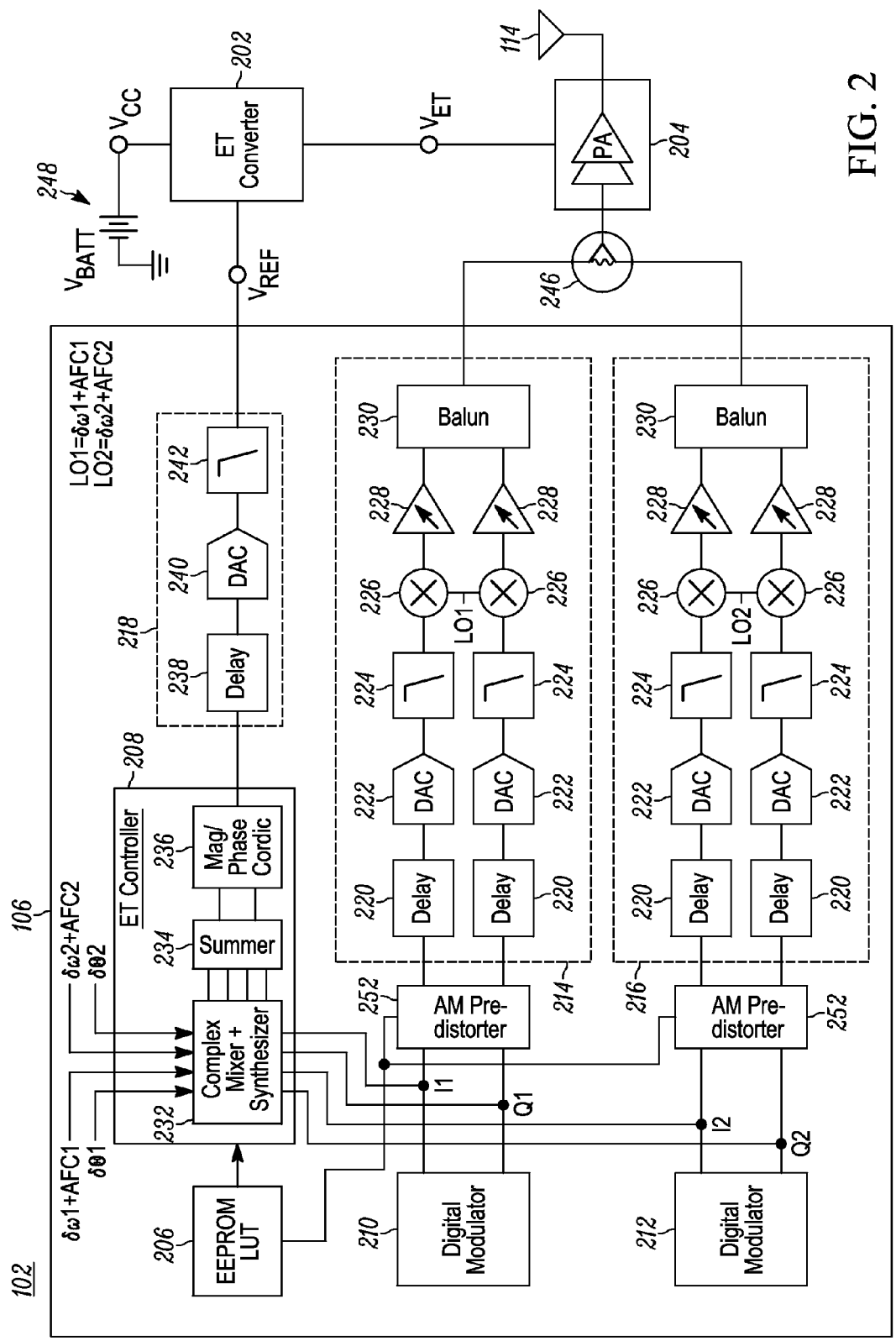
FIG. 2 is an example of a communication device in accordance with the present teachings.

FIG. 2 is a block diagram illustrating an example communication device, e.g., the communication device 102 of FIG. 1, configured for implementing one embodiment of the present teachings. Elements of the present teachings are implemented, for example, in the RFIC 106 of the communication device 102. Besides the RFIC 106, the communication device 102 includes an envelope tracking converter (ETC) 202 and a power amplifier (PA) 204.

In one embodiment, the RFIC 106 includes: at least two digital modulators, e.g., a first digital modulator 210 and a second digital modulator 212, an envelope tracking path, and first and second transmission line-ups 214 and 216, respectively. Only two transmission line-ups, corresponding to two transmit signals, sharing a single power amplifier 204 and corresponding single envelope tracking path are shown for ease of description. However, the present teachings can be extended to alternative embodiments wherein the communication device 102 simultaneously transmits more than two transmit signals, using more than two transmission line-ups that share the single power amplifier 204 and corresponding single envelope tracking path.

The envelope tracking path comprises an Electrically Erasable Programmable Read-Only Memory look-up table (EEPROM LUT) 206, an ET controller 208, and circuit elements 218. The ET controller 208, in this example implementation, includes a complex mixer and synthesizer 232, a summer 234, and a magnitude-phase coordinate rotation digital computer (cordic) 236. The circuit elements 218 include a delay element 238 also simply referred to as a "delay", a digital-to-analog converter (DAC) 240, and a filter 242.

Each of the transmission line-ups 214, 216 includes two delay elements or "delays" 220, two DACs 222, two filters 224, two multipliers 226, and two pre-amplifiers 228 for independently operating on I and Q components of a baseband signal. Each transmission line-up further includes one RF combiner, combiner, or balun 230. In one embodiment, an amplitude modulation pre-distorter 252 is coupled between the digital modulator 210 and the transmission line-up 214 and between the digital modulator 212 and the transmission line-up 216. One pre-distorter 252 provides pre-distorted I and Q components, e.g., I1 and Q1, of one baseband signal to the transmission line-up 214. The other pre-distorter 252 provides pre-distorted I and Q components, e.g., I2 and Q2, of a different baseband signal to the transmit lineup 216.

The ET controller 208 is coupled to at least one output of each of the digital modulators 210, 212 to sample I and Q components, e.g., I1, Q1, I2, Q2, that the digital modulators 210, 212 provide. The LUT 206 that is coupled to the ET controller 208 facilitates PA supply voltage shaping. In another embodiment, the LUT 206 is coupled to each of the two AM pre-distorters 252 to facilitate amplitude modulation (AM) pre-distortion. The digital modulators 210, 212 are configured to receive two different baseband signals from the baseband IC and convert each signal into, respective, digital I and Q signal components or coordinates, which collectively provide a rectangular coordinate representation of the baseband signal.

The ET controller 208 receives the I and Q signal components of the two baseband signals, and, in a manner explained later, uses the complex mixer and synthesizer 232, summer 234 and magnitude-phase cordic 236 to incorporate, into the first and second baseband signals, a plurality of offset components that are based on at least one offset characteristic between the two baseband signals. In one illustrative implementation, the at least one offset characteristics used to generate the offset components includes one or more or a combination of one or more frequency (ω)

offsets, phase (θ) offsets, amplitude offsets, or automatic frequency control (AFC) offsets. In one example, the ET controller 208 incorporates, into the baseband signals, offset components that are based on frequency offsets δω1+AFC1 and phase offset δθ1 and frequency offsets δω2+AFC2 and phase offset δθ2.

As used herein, an offset component is, in one embodiment, a value based on the result of applying a sinusoidal function to an offset characteristic. An offset in-phase component is, in one embodiment, a baseband in-phase component including one or more offsets generated through the application of a sinusoidal function. An offset quadrature component is, in one embodiment, a baseband quadrature component including one or more offsets generated through the application of a sinusoidal function. A partial composite quadrature component is a sum of a subset of quadrature offset components. A partial composite in-phase component is, in one embodiment, a sum of a subset of in-phase offset components. A composite in-phase component is, in one embodiment, a sum of the offset in-phase components comprising one or more baseband signals. A composite quadrature component is, in one embodiment, a sum of the offset quadrature components comprising one or more baseband signals. A composite sum is, in one embodiment, a sum of a square of the composite in-phase component and a square of the composite quadrature component. A composite baseband signal is, in one embodiment, a sum of the composite in-phase components and composite quadrature components of one or more baseband signals. A composite envelope signal, in one embodiment, is the square root of the square of the sum of the composite in-phase components of one or more baseband signals plus the square of the sum of the quadrature components of one or more baseband signals. A composite envelope reference voltage is a power supply voltage that the ET converter 202 supplies to the power amplifier 204.

The ET controller 208, in one example, retrieves appropriate pre-distortion values from LUT 206 to perform AM pre-distortion on the composite envelope signal. In one embodiment, the ET controller 208 applies an envelope pre-distortion using the AM pre-distorter 252 to compensate for distortion that is expected at an output of the power amplifier 204. For example, the AM pre-distortion is performed to compensate for amplifier gain, signal offset, RF signal delay, power amplifier temperature variances and/or associated RFIC 106 component temperatures.

After the ET controller 208 performs AM pre-distortion, the composite envelope signal is propagated through the circuit elements 218. In the circuit elements 218, the delay 238 compensates for temperature state of the RFIC 106, component induced delays, RFIC 106 temperatures, and/or the delay 238 is set in accordance with a timing advance or delays that a base station requests. The DAC 240 performs digital-to-analog conversion on the composite envelope signal, and the filter 242 removes distortions and alias components from the signal. The circuit elements 218 provide $V_{ref}$ as an output voltage to the ET converter 202, where $V_{ref}$ represents the composite envelope signal.

Source $V_{BATT}$ 248 provides a reference voltage $V_{cc}$ to the ET converter 202. ET converter 202 modulates $V_{cc}$ in accordance with amplitude values corresponding to the composite envelope signal Vref to generate the composite envelope reference voltage $V_{ET}$, also commonly known as a power supply voltage, from the composite envelope signal.

The digital modulators 210, 212 provide the I and Q components of two baseband signals represented by I1, Q1, I2, Q2 to the AM pre-distorters 252. The AM pre-distorters 252 introduce pre-distortion into the I1, Q1, I2, Q2 signal components to compensate for distortion that is expected at the output of the power amplifier 204.

In the example depicted, the I and Q components of a first baseband signal I1, Q1 are provided to the first transmission line-up 214, and the I and Q components of a second baseband signal I2, Q2 are provided to the second transmission line-up 216. The I and Q components of the first and second baseband signals are propagated to the, respective, delay elements 220, DACs 222, filters 224, multipliers 226, pre-amplifiers 228 and the combiners 230.

Figure 3:
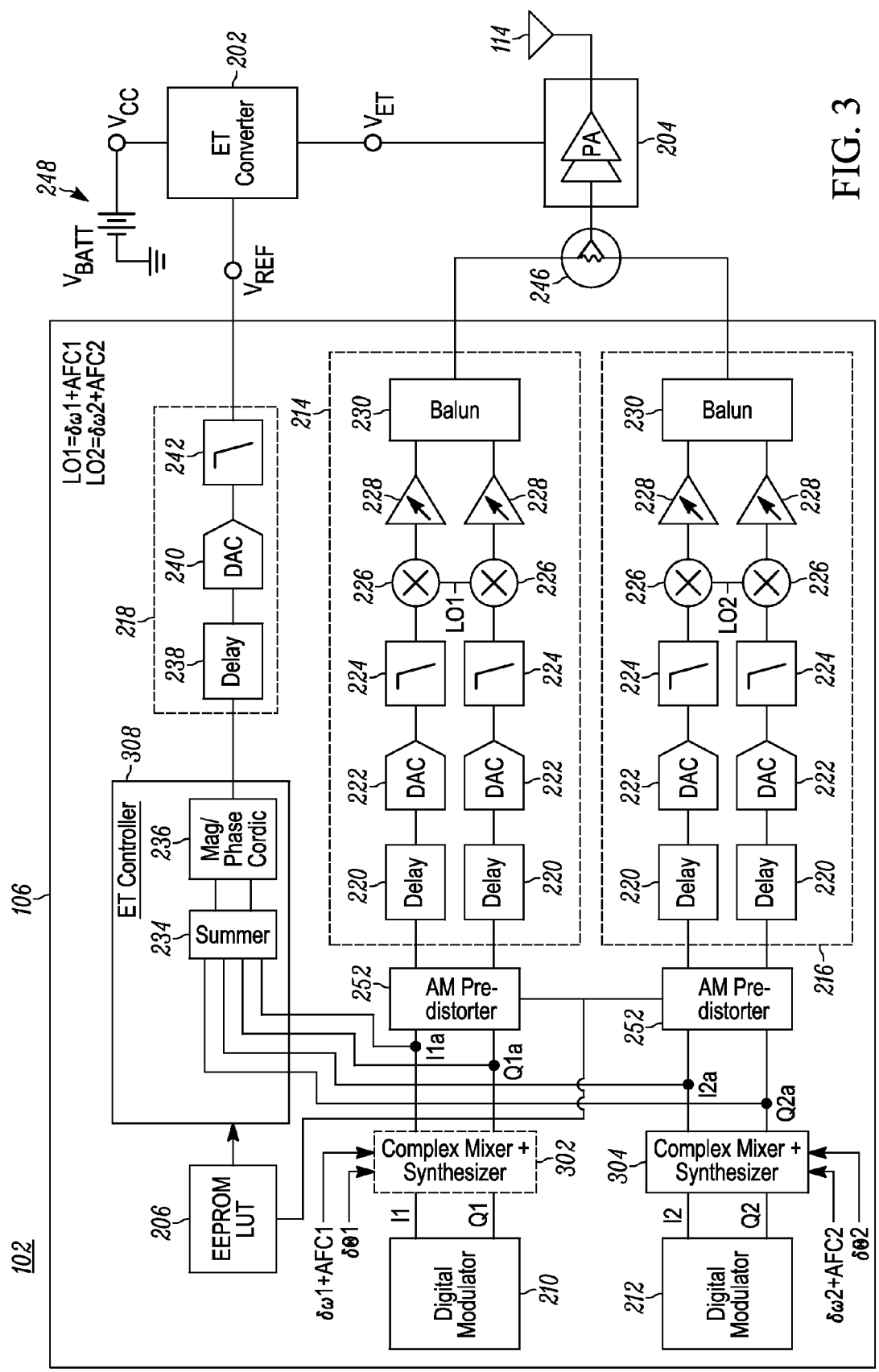
FIG. 3 is an example of a communication device in accordance with the present teachings.

The delay elements 220 introduce a delay, for example, to compensate for a temperature state of the RFIC 106, which compensates for delays introduced when propagating the first and second baseband signals through the RFIC 106, and/or in accordance with a timing advance or delay that a base station requests. The DACs 222 convert the baseband signals from digital to analog form. The filters 224 remove harmonic distortions and alias components in the baseband signals. The multipliers 226, also referred to in the art as frequency mixers, mix the baseband signals with in-phase and quadrature carrier signals (not shown) of a carrier signal having a carrier frequency constructed using local oscillator (LO) signals LO1 or LO2 (as shown) to up-convert the baseband signal to a higher frequency modulated RF signal in differential form. As seen in FIGS. 2 and 3, LO1 is substantially equivalent to δω1+AFC1 and LO2 is substantially equivalent to δω2+AFC2. The pre-amplifiers provide an additional power gain stage to form an amplified modulated RF signal in differential form. The combiners 230 convert the signal from differential to single ended form.

The first and second RF signals are propagated from the combiners 230 of the two transmission line-up 214, 216 to a combiner 246 which combines the signals and passes the combined signal to the power amplifier 204 for amplification before transmission by the antenna 114. The power amplifier 204 receives the composite envelope reference voltage $V_{ET}$ synchronously with the combined RF signal that it is amplifying to generate the amplified combined RF signal.

Accordingly, the RFIC 106 is configured to receive a plurality of baseband signals. The ET controller 208 receives the I and Q components that the digital modulators 210, 212 communicate. The ET controller 208 is configured to calculate a composite envelope signal based on combined I and Q components of the at least two baseband signals. Further, the ET controller 208 is configured to pre-distort the composite envelope signal which is based on the plurality of transmit signals, such that amplitudes of the transmit signals result in decreasing RF signal gain at high RFIC 106 drive levels. The ET controller 208 also shapes the composite envelope signal associated with the plurality of transmit signals to provide increasing power amplifier gains at high drive levels.

Through the use of delays, including delays 220 and 238, the composite envelope reference voltage $V_{ET}$ generated from a sampling of the plurality of transmit signals at a time t, is synchronously received at the power amplifier 204 at the same time as the combined RF signal that was created from the plurality of transmit signals sampled at time t. This enables the power amplifier 204 to amplify the combined RF signal with increased gains at higher signal drive levels, and lower constant gain at lower signal drive levels, which leads to an increased amplifier efficiency without causing a gain reduction in the power amplifier 204.

Turning now to FIG. 3, which depicts one embodiment of a communication device, e.g., the communication device 102 of FIG. 1, in accordance with the current teachings. The embodiment depicted in FIG. 3 includes many of the same components configured in a substantially similar manner as components of FIG. 2. Thus, a redundant description of similar components is not presented. A difference between the two figures, however, is the configuration and functionality of the complex mixer(s), which is shown as being included within the ET controller 208 in FIG. 2, and appears outside of the ET controller 308 in FIG. 3.

More particularly, the embodiment depicted in FIG. 3 shows a first complex mixer and synthesizer 302 as a dashed block coupled to the digital modulator 210 and a second complex mixer and synthesizer 304 coupled to the digital modulator 212. This is because, as is explained in detail later, some embodiments use a single complex mixer and synthesizer coupled to only one of the digital modulators. While other embodiments includes multiple complex mixers and synthesizers. Also, in the embodiment depicted in FIG. 3, the multipliers 226 up-convert both baseband signals to respective RF signals using the same carrier frequency, represented as LO1. Whereas, in the embodiment depicted in FIG. 2, the multipliers 226 up-convert the baseband signals to respective RF signals using different carrier frequencies, represented as LO1 and LO2.

In one embodiment, the first complex mixer and synthesizer 302 is configured to incorporate frequency and phase offsets, shown as $\delta\omega 1+AFC1$ and $\delta\theta 1$, into I and Q components of the first baseband signal. The second complex mixer and synthesizer 304 is configured to incorporate frequency and phase offset, shown as $\delta\omega 2+AFC2$ and $\delta\theta 2$, into I and Q components of the second baseband signal. The ET controller 308 receives the I and Q components of the plurality of baseband signals after the frequency and phase offsets are incorporated into the baseband signals.

Figure 4:
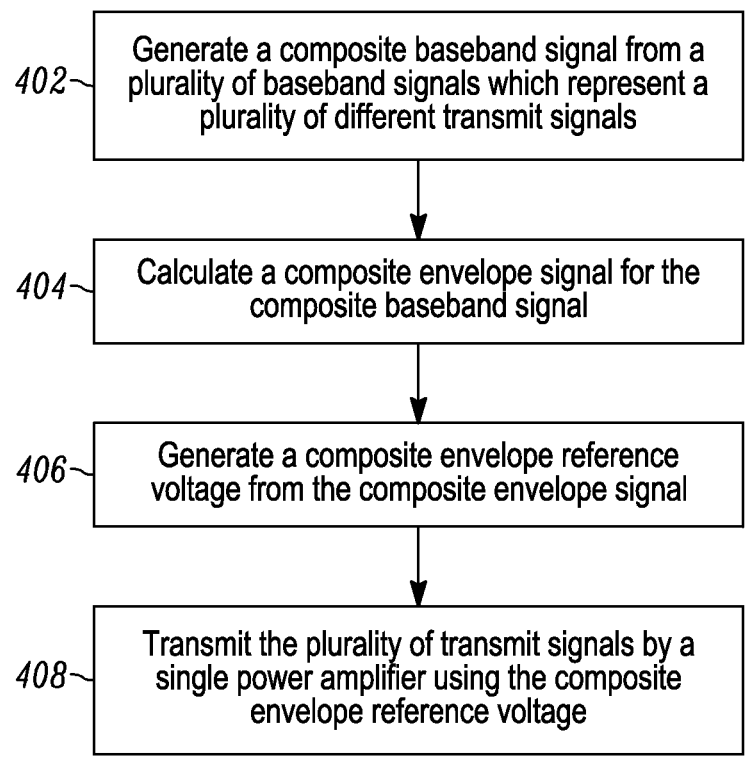
FIG. 4 is a logical flow chart illustrating one example of a method of generating a composite envelope reference voltage in accordance with the present teachings.

In general, both the embodiment depicted in FIG. 2 or the embodiment depicted in FIG. 3 includes an integrated circuit, such as RFIC 106, configured to perform a method for generating a composite envelope reference voltage $V_{ET}$ for a plurality of transmit signals. One such method is demonstrated by reference to a method 400 shown in FIG. 4. At 402, the integrated circuit generates a composite baseband signal from a plurality of baseband signals that represent a plurality of different transmit signals. In one example, the ET controller 208, 308 and the complex mixers and synthesizers 232, 302 and 304 are configured to generate a composite baseband signal from the I1, Q1, I2, and Q2 components received from the digital modulators 210, 212, wherein the I1, Q1, I2, and Q2 components represent two different transmit signals. The composite baseband signal is characterized by a composite in-phase component Ic and a composite quadrature component Qc. In one embodiment, the baseband signals within the plurality of baseband signals are correlated. In another embodiment the baseband signals within the plurality of baseband signals are uncorrelated. Where the baseband signals used to generate the composite baseband signal are uncorrelated, the composite baseband signal can be generated using a number of different embodiments of hardware and corresponding functionality as illustrated, for example, by reference to the hardware and functionality described later with respect to FIGS. 5-15.

At 404, the integrated circuit calculates a composite envelope signal for the composite baseband signal. In an embodiment, calculating the composite envelope signal, Vref, for the composite baseband signal comprises the magnitude-phase cordic 236: summing a square of the composite in-phase component Ic with a square of the composite quadrature component to generate a composite sum; and calculating a square root of the composite sum.

The magnitude-phase cordics 236 shown in the FIGS. 7, 8, 10, 11, 13, and 14 are configured to facilitate calculating the composite envelope signal in this manner. The output of cordic 236 is processed by the circuit elements 218 to generate the composite envelope signal Vref.

At 406, a composite envelope reference voltage $V_{ET}$ is generated from the composite envelope signal Vref. In one example, the ET converter 202 generates the composite envelope reference voltage $V_{ET}$. At 408, the power amplifier 204 transmits the plurality of transmit signals, as a combined RF signal, using or as driven or powered by the composite envelope reference voltage $V_{ET}$. For example, the plurality of transmit signals, are received by the transmission line-up 214, 216 from the digital modulators 210, 212. The transmission line-ups 214 and 216 generate the combined RF signal that the power amplifier 204 transmits using the composite envelope reference voltage $V_{ET}$.

Figure 5:
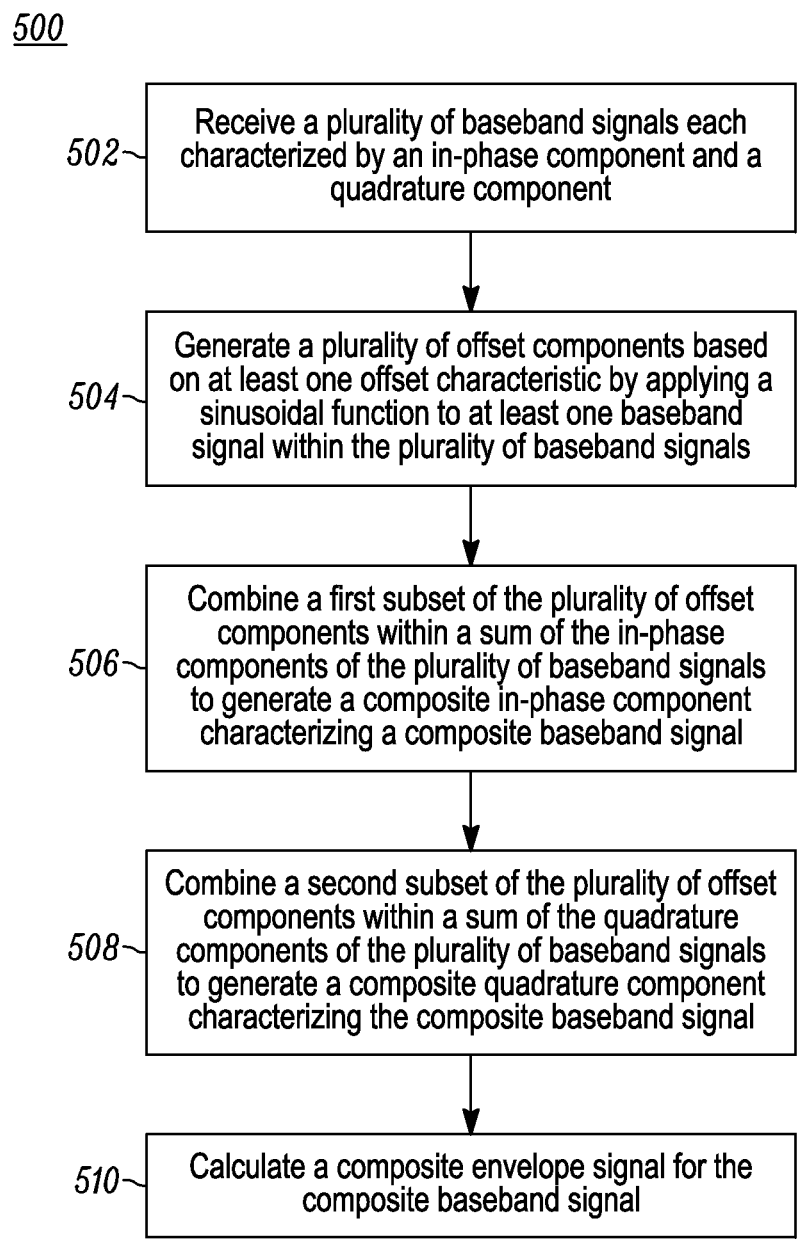
FIG. 5. is a logical flow chart illustrating a method for calculating the composite envelope signal in accordance with the present teachings.

Turning now to FIG. 5, which shows a logical flow chart illustrating a method 500 for calculating the composite envelope signal for the composite baseband signals. The method 500 is performed, in one example, on an integrated circuit, such as RFIC 106. More specifically, in one example ET controller 208 comprising the complex mixer and synthesizer 232 of FIG. 2 performs the method 500, and in another example the complex mixers and synthesizer 302, 304 in conjunction with the ET controller 308 of FIG. 3 performs the method 500. At 502, the plurality of baseband signals each characterized by an in-phase component and a quadrature component are received. In one example the ET controller 208 receives the baseband signals, in another example the complex mixers and synthesizer 302, 304 receive the baseband signals. At 504, a plurality of offset components based on at least one offset characteristic are generated by applying a sinusoidal function to at least one baseband signal within the plurality of baseband signals. In one example, the ET controller 208 generates the plurality of offset components, in another example the complex mixers and synthesizers 302, 304 generate the plurality of offset components. At 506, a first subset of the plurality of offset components are combined within a sum of the in-phase components of the plurality of baseband signals to generate a composite in-phase component characterizing a composite base-band signal. At 508, a second subset of the plurality of offset components are combined within a sum of the quadrature components of the plurality of baseband signals to generate a composite quadrature component characterizing the composite base-band signal. In one embodiment, ET controller 208 combines the plurality of offset components within the plurality of baseband signals. In another embodiment, the complex mixers and synthesizers 302, 304 in conjunction with the ET controller 308 does this combining. At 510, the ET controller 208 or 308 calculates the composite envelope signal for the composite baseband signal, for instance as described above by reference to block 404 of FIG. 4.

Figure 6:
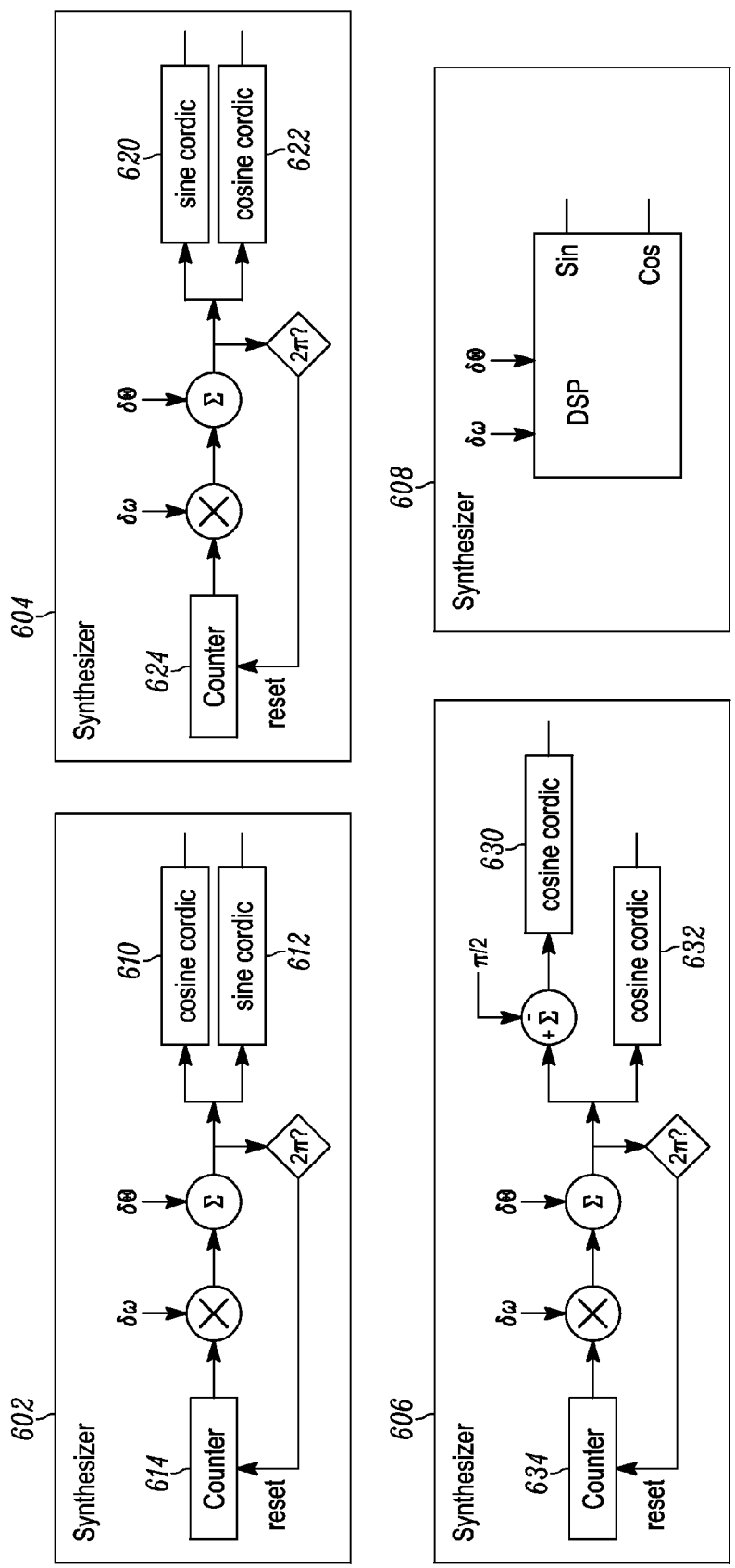
FIG. 6 is a block diagram illustrating synthesizers in accordance with the present teachings.

Turning now to FIG. 6, which shows a plurality of different synthesizers configured for combining offsets into baseband components. The different synthesizers generate a plurality of offset components by applying a sinusoidal function to at least one baseband signal within a plurality of baseband signals. Each of the synthesizers 602, 604, 606, 608 is implemented as either a plurality of cordics or a digital signal processor. Also, each of the synthesizers is configured to receive one or more offsets, for example, the frequency offset $\omega$ and/or the phase offset $\theta$, and combine the offsets into a component of a baseband signal, such as an in-phase or quadrature component of the baseband signal.

FIG. 6 illustrates synthesizers which incorporate the offsets ω and θ using sine and cosine cordics. FIG. 6d illustrates a DSP which is also configured to receive phase and frequency offsets ω and θ and use sine and cosine functions to combine the offsets into a component of a baseband signal. Although only one DSP implementation is shown 6d, in other example embodiments, DSP implementations are used to perform the functions of the synthesizers shown in FIG. 6.

Figure 7:
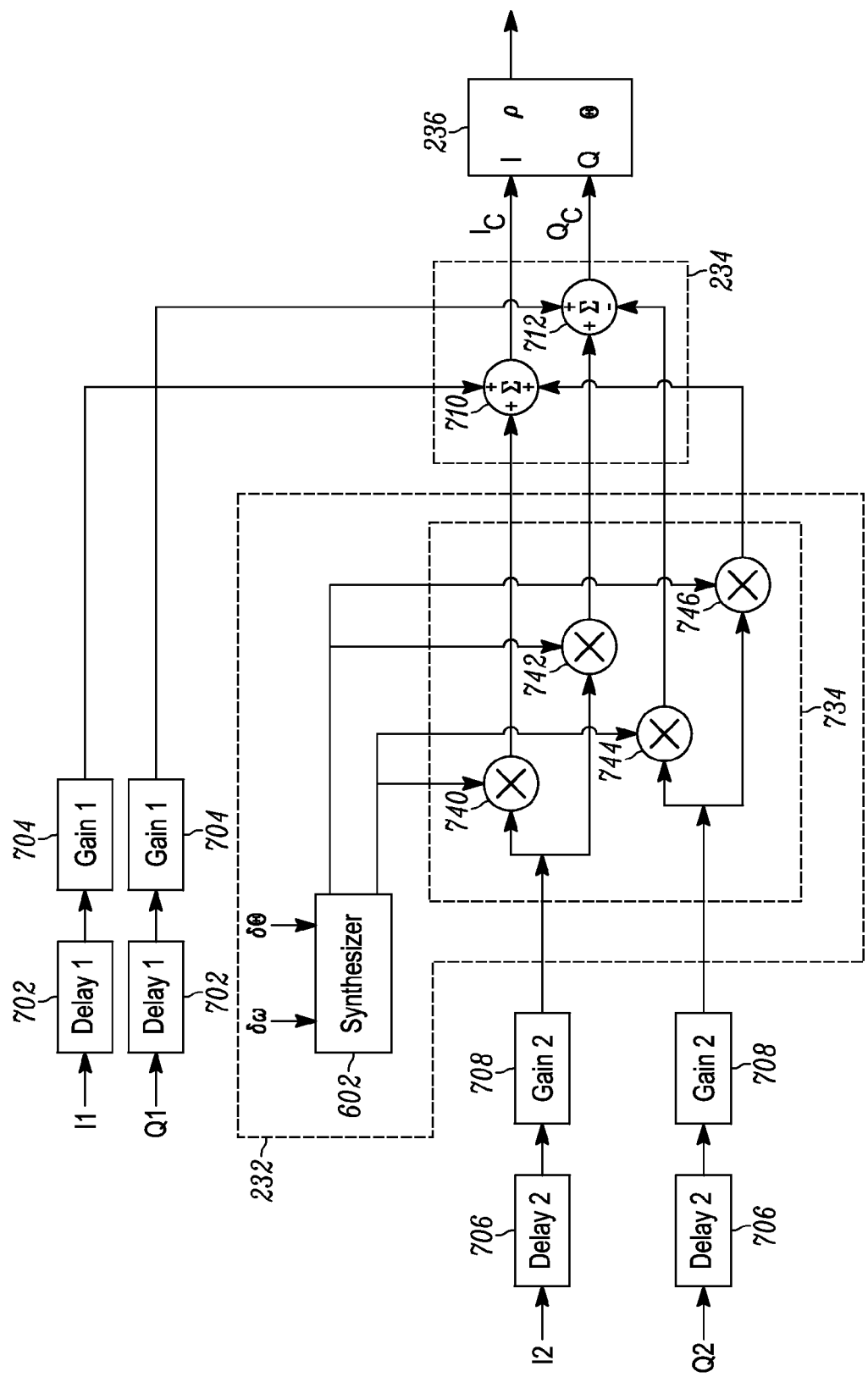
FIG. 7 illustrates one example of an envelope tracking controller in accordance with the present teachings.

Turning now to FIG. 7, shown therein is one example of an ET controller with an internal complex mixer and synthesizer, for example ET controller 208, for generating a composite envelope signal in accordance with the present teachings. The ET controller 208, in one embodiment includes: first delays 702; first gains 704; second delays 706; second gains 708; the complex mixer and synthesizer 232 comprising a plurality of multipliers 740, 742, 744, and 746 and the synthesizer 602; the summer 234 comprising adders 710 and 712; and the magnitude-phase cordic 236. The multipliers 740, 742, 744, and 746 implement a complex mixer 734.

In one embodiment, the ET controller 208 is configured to receive baseband signal components I1, Q1, I2, and Q2 which are the I and Q components of a first and second baseband signal, respectively. The delays 702, 706, in one example, compensate for amplifier gain, signal offset, RF signal delay, power amplifier characteristics, base station requested timing advances or delay, and/or associated RFIC 106 component temperatures. The ET controller 208 adjusts the gains 704, 708 to compensate for signal drive levels.

The following equation (1) is one mathematical representation of an implementation of the ET controller 208, which is shown in FIG. 7.

$$Env=[(I1+I2*\cos(\delta\omega*t+\delta\omega)-Q2*\sin(\delta\omega*t+\delta\theta))^2+ (Q1+Q2*\cos(\delta\omega*t+\delta\theta)+I2*\sin(\delta\omega*t+\delta\theta))^2]^{1/2} \quad (1)$$

In one example embodiment, the synthesizer 602 is configured to receive at least one offset characteristic comprised of at least one of a phase offset and a frequency offset, respectively, represented by the symbols δω and δθ in FIG. 7. The synthesizer 602 operates with the multipliers 740, 742, 744, and 746 to combine the offset characteristics into the in-phase and quadrature components of one or more baseband signals to generate the plurality of offset components comprising the offset in-phase components and the offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one or more AFC offsets, such as the AFC1 and the AFC2. In cases where the first and second baseband signals are transmitted to different base stations, the AFC offset is used in facilitating fidelity of the two signals that are transmitted to the two different base stations.

The adder 712 combines a first subset of the plurality offset components within a sum of the in-phase components of the plurality of baseband signals to generate a composite in-phase component Ic. The adder 710 combines a second subset of the plurality offset components within a sum of the quadrature components of the plurality of baseband signals to generate a composite quadrature component Qc. The magnitude-phase cordic 236 uses Ic and Qc to generate the composite envelope signal.

Figure 8:
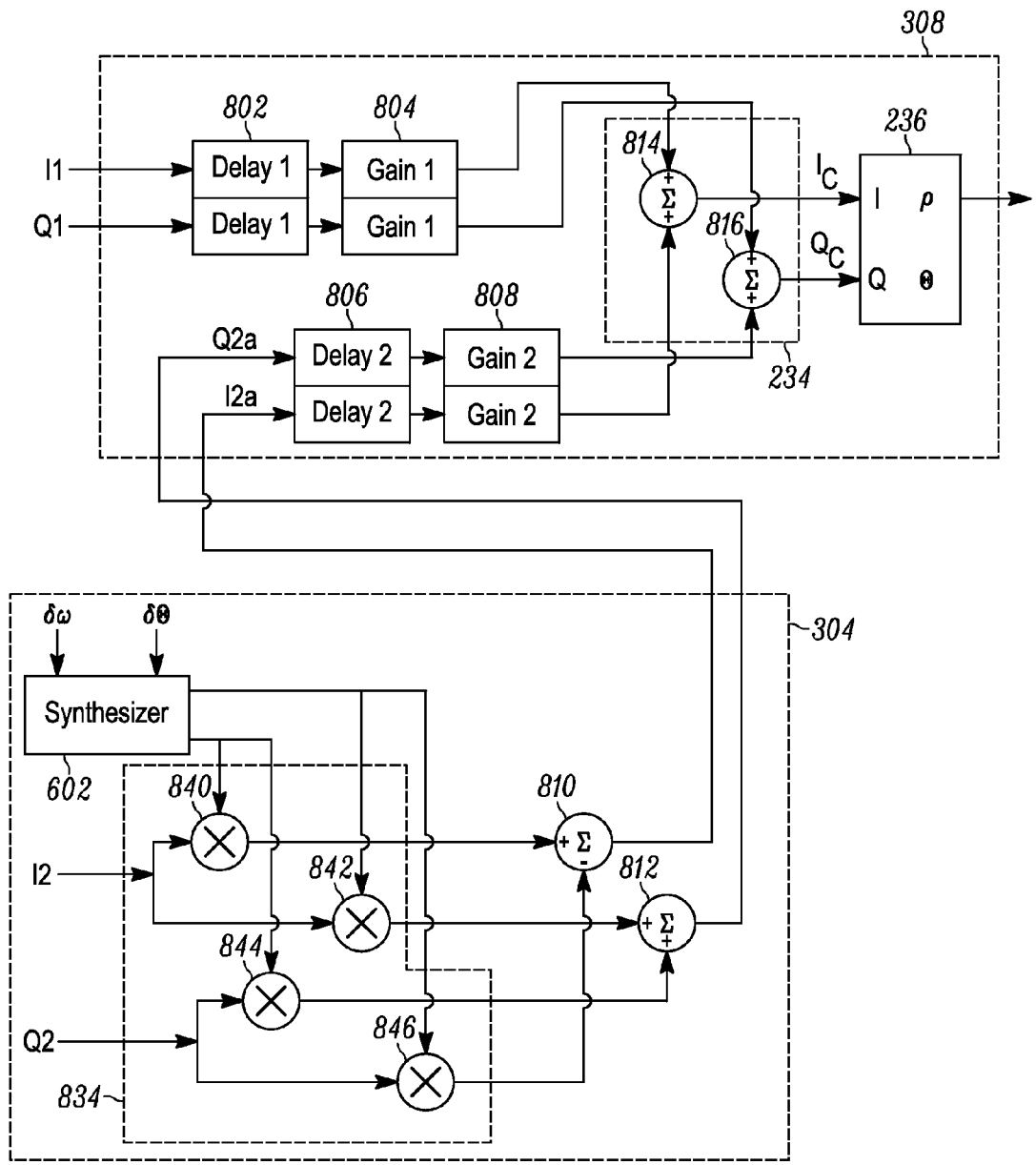
FIG. 8 illustrates one example of an envelope tracking controller and complex mixer and synthesizer in accordance with the present teachings.

Turning now to FIG. 8, shown therein is one example of an ET controller, for example ET controller 308, for generating a composite envelope signal in accordance with the present teachings. The ET controller 308, in one embodiment includes: first delays 802; first gains 804; second delays 806; second gains 808; the complex mixer and synthesizer 304 comprising a plurality of multipliers 840, 842, 844, and 846 and the synthesizer 602; the summer 234 comprising adders 814, and 816; and the magnitude-phase cordic 236. The multipliers 840, 842, 844, and 846 implement a complex mixer 834.

The complex mixer and synthesizer 304, in one embodiment, is coupled to outputs of the second digital modulator 212. In one example embodiment, complex mixer and synthesizer 304 is configured to receive baseband signal components I2, and Q2 which are the I and Q components of the second baseband signal. In one embodiment, the RFIC 106 includes a second complex mixer and synthesizer 302 coupled to an output of the first digital modulator, and the second complex mixer and synthesizer 302 passes through the I and Q signals of the first digital modulator to the ET controller 308. In another embodiment, the ET controller 308 samples I and Q signals from signal lines coupled to the first digital modulator 210 without an intervening complex mixer and synthesizer coupled to the first digital modulator 210. In one embodiment, the ET controller 308 is configured to receive I1, Q1 baseband signal components.

The delays 802, 806, in one example, compensate for amplifier gain, signal offset, RF signal delay, power amplifier characteristics, base station requested timing advances or delay, and/or associated RFIC 106 component temperatures. The ET controller 208 adjusts the gains 804, 808 to compensate for signal drive levels.

In one example embodiment, the synthesizer 602 is configured to receive at least one offset characteristic comprised of at least one of a phase offset and a frequency offset, respectively, represented by the symbols δω and δθ in FIG. 8. The synthesizer 602 operates with the multipliers 840, 842, 844, and 846 to combine offset characteristics into the in-phase and quadrature components of one or more baseband signals to generate the plurality of partial offset components comprising the partial offset in-phase components and the partial offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one of more AFC offsets, such as the AFC1 and the AFC2. In cases where the first and second baseband signals are transmitted to different base stations, the AFC offset is used in facilitating fidelity of the two signals that are transmitted to the two different base stations.

The adder 814 combines a partial composite in-phase component within a sum of the in-phase components of the plurality of baseband signals to generate a composite in-phase component Ic. The adder 816 combines a partial composite quadrature component within a sum of the quadrature components of the plurality of baseband signals to generate a composite quadrature component Qc. The magnitude-phase cordic 236 uses Ic and Qc to generate the composite envelope signal.

Figure 9:
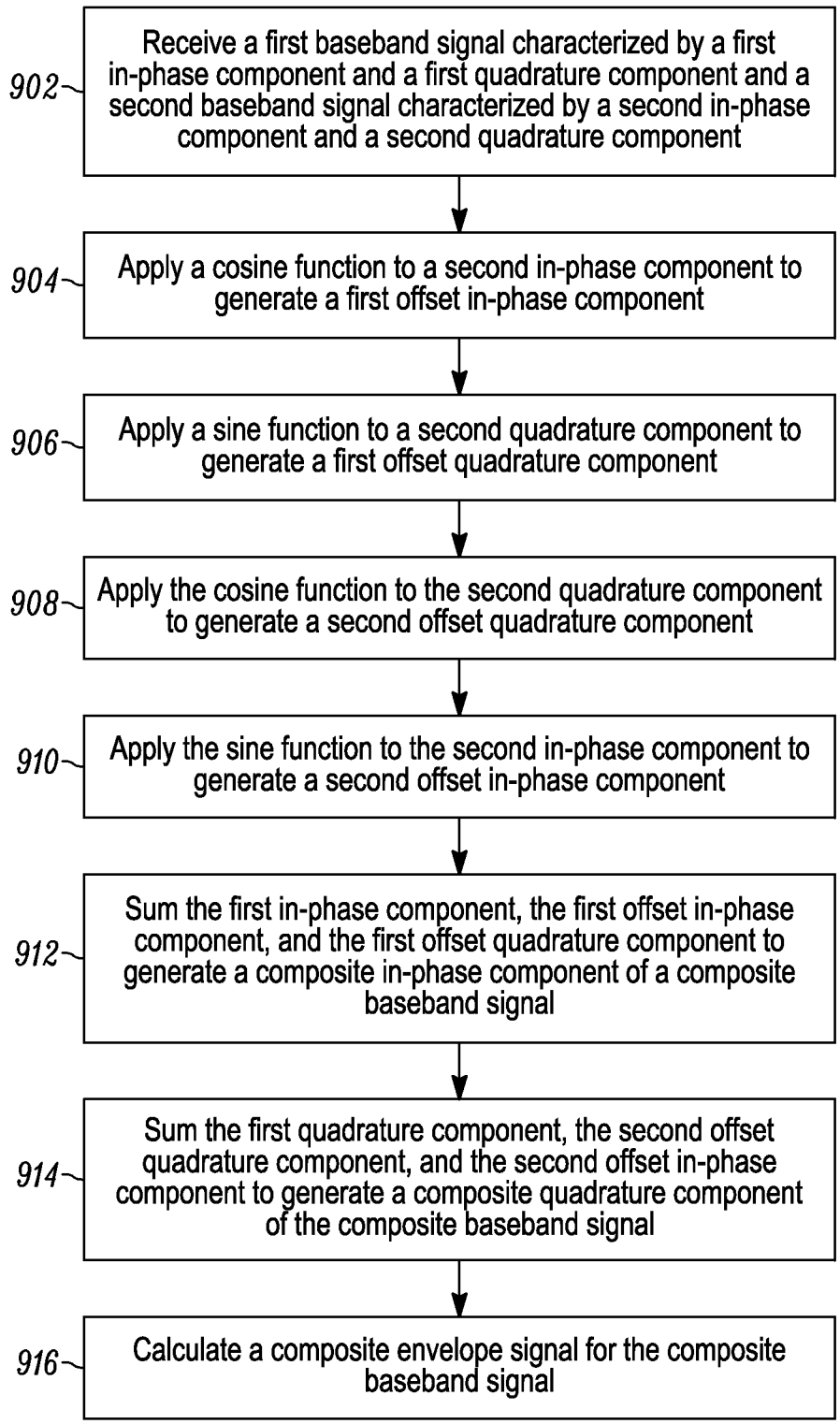
FIG. 9 is a logical flow chart illustrating a method for calculating the composite envelope signal in accordance with the present teachings.

Turning now to FIG. 9, which shows a logical flow chart illustrating a method 900 for generating a composite envelope signal. The method 900 is described in conjunction with the circuits shown in FIG. 7 and FIG. 8.

The method 900 includes applying a sinusoidal function to the at least one baseband signal within the plurality of baseband signals, which comprises, at 902, a first baseband signal characterized by a first in-phase component I1 and a first quadrature component Q1 and a second baseband signal characterized by a second in-phase component I2 and a second quadrature component Q2 is received. In FIG. 7, the delay and gains 702, 704, and 706, 708, receive and process the I1, Q1, and I2, Q2 components, respectively. In FIG. 8, the delay and gains 802, 804, and 806, 808 receive and process the I1, Q1, and the I2a, Q2a components, respectively.

At 904, a cosine function generated using the cosine cordic 610 of synthesizer 602 is applied to the second in-phase component I2 using the multiplier 742 in FIG. 7 or the multiplier 842 in FIG. 8 to generate a first offset in-phase component, e.g., $I2*\cos(\delta\omega*t+\delta\omega)$ of equation (1). At 906, a sine function generated using the sine cordic 612 of synthesizer 602 is applied to the second quadrature component Q2 using the multiplier 744 in FIG. 7 or the multiplier 844 in FIG. 8 to generate a first offset quadrature component $Q2*\sin(\delta\omega*t+\delta\theta)$ of equation (1). At 908, the cosine function generated using the cosine cordic 610 is applied to the second quadrature component Q2 using the multiplier 746 in FIG. 7 and or multiplier 846 in FIG. 8 to generate a second offset quadrature component, e.g., $Q2*\cos(\delta\omega* t+\delta\theta)$ of equation (1). At 910, a sine function generated using the sine cordic 612 of synthesizer 602 is applied to the second in-phase component I2 using the multiplier 740 in FIG. 7 or the multiplier 840 in FIG. 8 to generate a second offset in-phase component, e.g., $I2*\sin(\delta\omega* t+\delta\theta)$ of equation (1).

At 912, the adder 712 of FIG. 7 or 810 and 814 of FIG. 8 sum the first in-phase component I1, the first offset in-phase component $I2*\cos(\delta\omega*t+\delta\theta)$, and the first offset quadrature component, e.g., $Q2*\sin(\delta\omega*t+\delta\theta)$ to generate the composite in-phase component Ic of the composite baseband signal. More particularly, with respect to FIG. 8, the adder 810, receives terms $I2*\cos(\delta\omega*t+\delta\theta)$, $Q2*\sin(\delta\omega*t+\delta\theta)$ and outputs partial composite in-phase component I2a which is combined with I1 at adder 814 to generate the composite in-phase component.

At 914, the adder 710 of FIG. 7 or 812 and 816 of FIG. 8 sum the first quadrature component Q1, the second offset quadrature component $Q2*\cos(\delta\omega*t+\delta\theta)$, and the second offset in-phase component, $I2*\sin(\delta\omega*t+\delta\theta)$ to generate the composite quadrature component Qc of the composite baseband signal. More particularly, with respect to FIG. 8, the adder 810, receives terms $Q2*\cos(\delta\omega*t+\delta\theta)$, $I2*\sin(\delta\omega*t+\delta\theta)$ and outputs partial composite quadrature component Q2a which is combined with Q1 at adder 816 to generate the composite quadrature component. At 916, magnitude-phase cordic 236 receives the composite in-phase component Ic and the composite quadrature component Qc and generates the composite envelope signal, for example, as described above by reference to 404 of FIG. 4.

As previously described, each baseband signal in the plurality of baseband signals is characterized by an in-phase component and a quadrature component. Further, generating the composite baseband signal from the plurality of baseband signals comprises: summing the in-phase components of the plurality of baseband signals to generate a composite in-phase component; and summing the quadrature components of the plurality of baseband signals to generate a composite quadrature component. Further, calculating the composite envelope signal for the composite baseband signal comprises: summing a square of the composite in-phase component with a square of the composite quadrature component to generate a composite sum; and calculating a square root of the composite sum. In other words, a square of the composite in-phase component is added with a square of the composite quadrature component to generate a composite sum, and at 916 the square root of the composite sum is calculated to calculate the composite envelope signal for the composite baseband signal. In one embodiment, the magnitude-phase cordic 236 receives the composite in-phase component Ic and composite quadrature component Qc and performs step 916 to calculate the composite envelope signal, for instance as described above by reference to block 404 of FIG. 4.

Figure 10:
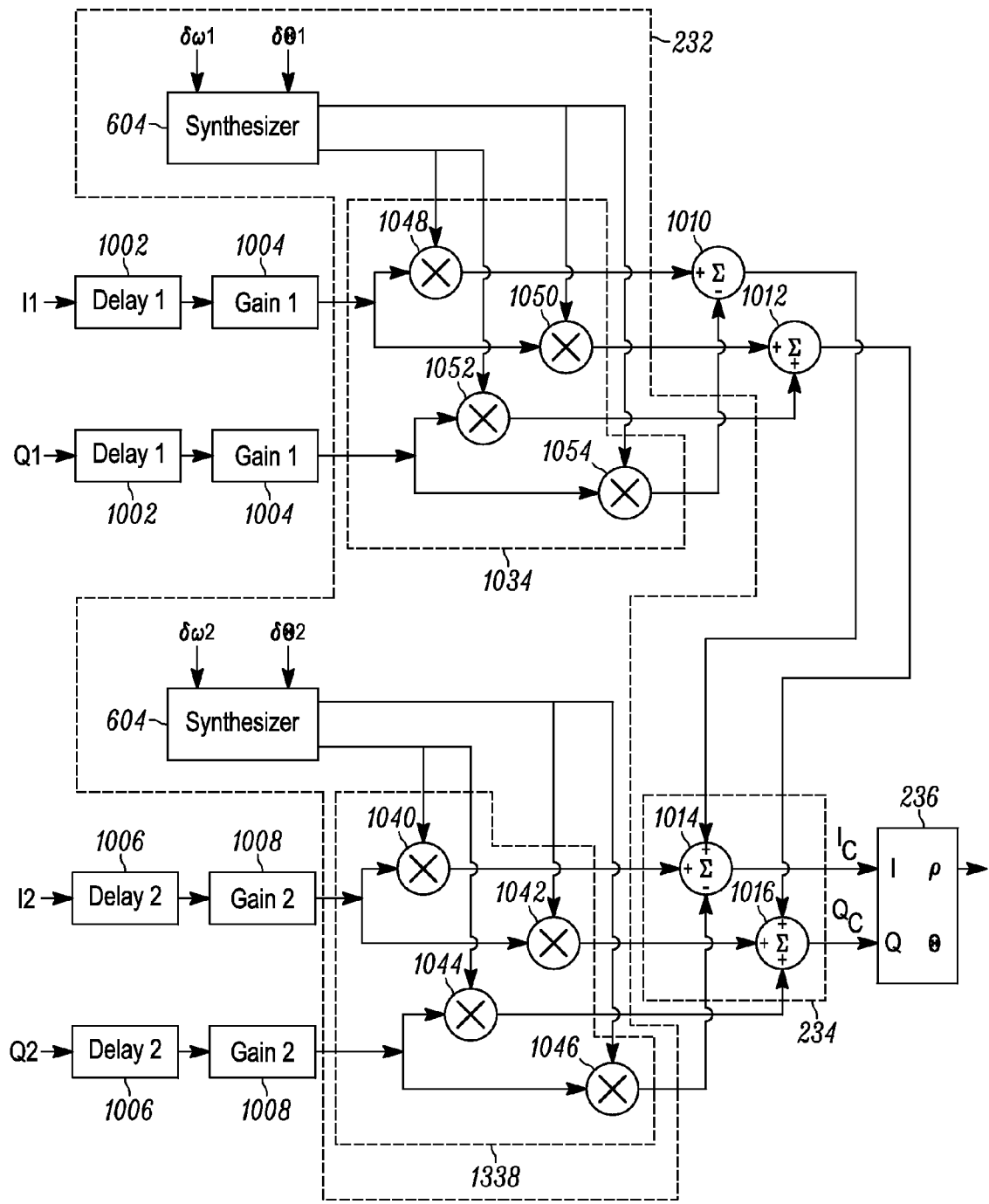
FIG. 10 is a block diagram illustrating one example of an envelope tracking controller in accordance with the present teachings.

Turning now to FIG. 10, shown therein is one example of an ET controller with an internal complex mixer and synthesizer, for example ET controller 208, for generating a composite envelope signal in accordance with the present teachings. The ET controller 208 depicted in FIG. 10 includes: first delays 1002; first gains 1004; second delays 1006; second gains 1008; the complex mixer and synthesizer 232 comprising a plurality of multipliers 1040, 1042, 1044, 1046, 1048, 1050, 1052, and 1054, and the synthesizer 604; the summer 234 comprising adders 1014 and 1016; and the magnitude-phase cordic 236. The multipliers 1040, 1042, 1044, 1046, 1048, 1050, 1052, and 1054, implement the complex mixers 1034, 1038.

The following equation (2) is one mathematical representation an implementation of the ET controller 208, which is shown in FIG. 10.

$$Env=[(I1*\cos(\theta 1)-Q1*\sin(\theta 1)+I2*\cos(\theta 2)-Q2*\sin(\theta 2))^2+(I1*\sin(\theta 1)+Q1*\cos(\theta 1)+I2*\sin(\theta 2)+Q2*\cos(\theta 2))^2]^{1/2} \quad (2)$$

In one example embodiment, the synthesizer 604 is configured to receive at least one offset characteristic comprised of at least one of a phase offset and a frequency offset, respectively, represented by the symbols $\delta\omega 1$, $\delta\omega 2$, $\delta\theta 1$, and $\delta\theta 2$, in FIG. 10.

The synthesizer 604 operates with the multipliers 1040, 1042, 1044, 1046, 1048, 1050, 1052, and 1054 to combine the offset characteristics into the in-phase and quadrature components of one or more baseband signals to generate the plurality of offset components comprising the offset in-phase components and the offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one of more AFC offsets, such as the AFC1 and the AFC2. In cases where the first and second baseband signals are transmitted to different base stations, the AFC offset is used in facilitating fidelity of the two signals that are transmitted to the two different base stations.

The summer 1014 combines a first subset of the plurality offset components within a second subset of in-phase components of the plurality of baseband signals to generate a composite in-phase component Ic. The summer 1016 combines a third subset of the plurality offset components within a fourth subset of quadrature components of the plurality of baseband signals to generate a composite quadrature component Qc. The magnitude-phase cordic 236 uses Ic and Qc to generate the composite envelope signal.

Figure 11:
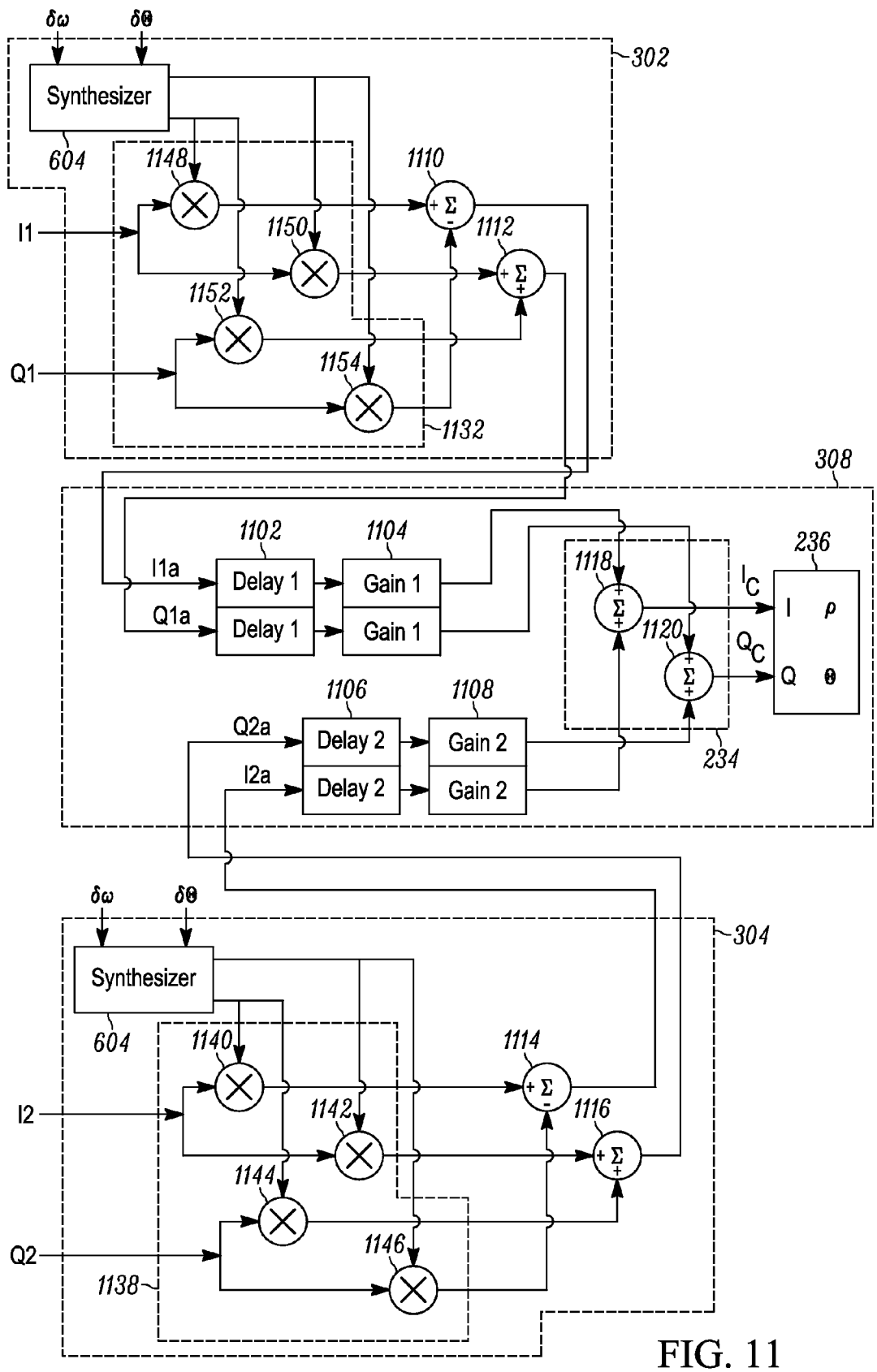
FIG. 11 is a block diagram illustrating one example of an envelope tracking controller and complex mixer and synthesizer in accordance with the present teachings.

Turning now to FIG. 11, shown therein is one example of an ET controller, for example ET controller 308, for generating a composite envelope signal in accordance with the present teachings. The ET controller 308, in one embodiment includes: first delays 1102; first gains 1104; second delays 1106; second gains 1108; the complex mixer and synthesizers 302, 304. Complex mixer and synthesizer 304 comprising a plurality of multipliers 1140, 1142, 1144, and 1146. Complex mixer and synthesizer 302 comprising a plurality of multipliers 1148, 1150, 1152, and 1154. Further, each of the complex mixer and synthesizers 302, 304 includes the synthesizer 604. The ET controller 308 includes the summer 234 comprising adders 1118, and 1120; and the magnitude-phase cordic 236. The multipliers 1140, 1142, 1144, and 1146 implement the complex mixer 1138 of the complex mixer and synthesizer 304. The multipliers 1148, 1150, 1152, and 1154 implement the complex mixer 1132 of the complex mixer and synthesizer 302.

The complex mixer and synthesizer 304, in one embodiment, is coupled to outputs of the second digital modulator 212. Complex mixer and synthesizer 304 is configured to receive the in-phase and quadrature components of a baseband signal. The complex mixer and synthesizer 302, in one embodiment, is coupled to outputs of the first digital modulator 210. Complex mixer and synthesizer 302 is configured to receive the in-phase and quadrature components of a baseband signal.

In one embodiment, the ET controller 308 is configured to receive first and second partial composite in-phase and quadrature baseband signal components I1a, Q1a, I2a, Q2a. The delays 1102, 1106, in one example, compensate for amplifier gain, signal offset, RF signal delay, power amplifier characteristics, base station requested timing advances or delay, and/or associated RFIC 106 component temperatures. The ET controller 308 adjusts the gains 1104, 1108 to compensate for signal drive levels.

In one example embodiment, the synthesizer 604 is configured to receive at least one offset characteristic comprised of at least one of a phase offset and a frequency offset, respectively, represented by the symbols $\delta\omega$ and $\delta\theta$ in FIG. 11. The synthesizers 604 operates with the multipliers 1140, 1142, 1144, 1146, 1148, 1150, 1152, and 1154 to combine offset characteristics into the in-phase and quadrature components of one or more baseband signals to generate the plurality of partial offset components comprising the partial offset in-phase components and the partial offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one or more AFC offsets, such as the AFC1 and the AFC2. In cases where the first and second baseband signals are transmitted to different base stations, the AFC offset is used in facilitating fidelity of the two signals that are transmitted to the two different base stations.

The summer 1118 combines a first partial composite in-phase component and a second partial composite in-phase component to generate a composite in-phase component Ic. The summer 1120 combines a first partial composite quadrature component and a second partial composite quadrature component to generate a composite quadrature component Qc. The magnitude-phase cordic 236 uses Ic and Qc to generate the composite envelope signal.

Figure 12:
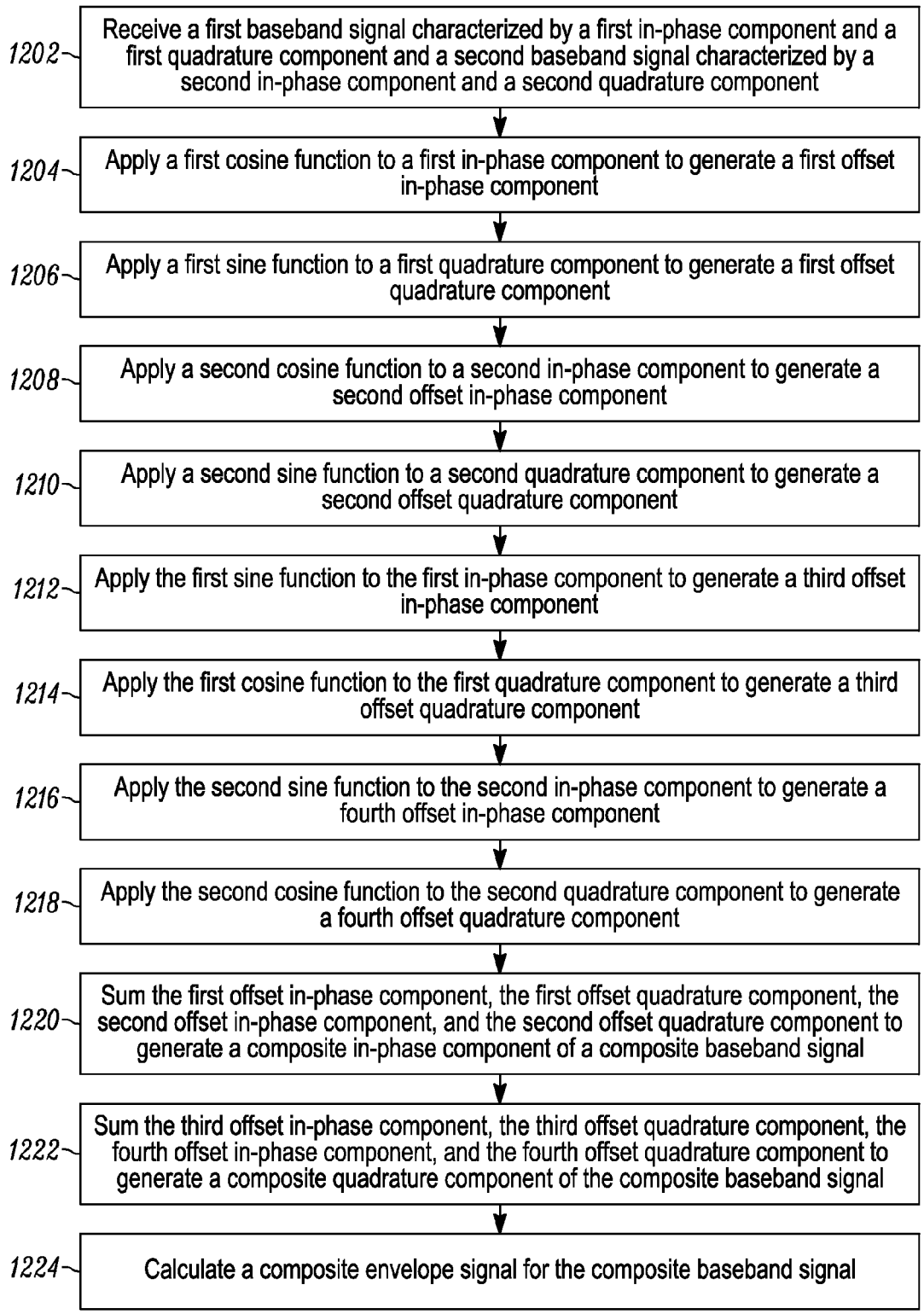
FIG. 12 is a logical flow chart illustrating a method for calculating the composite envelope signal in accordance with the present teachings.

Turning now to FIG. 12, which shows a logical flow chart illustrating a method 1200 for generating a composite envelope signal. The method 1200 is described in conjunction with the circuits shown in FIG. 10 and FIG. 11.

At 1202, a first baseband signal characterized by a first in-phase component I1 and a first quadrature component Q1 and a second baseband signal characterized by a second in-phase component I2 and a second quadrature component Q2 is received. In FIG. 10, the first delay and gains 1002, 1004, receive and process the components I1, Q1, and the second delay and gains 1006, 1008, receive and process the components I2, Q2. In FIG. 11, the first delay and gains 1102, 1104, receive and process the partial components I1a, Q1a, and the second delay and gains 1106, 1108, receive and process the partial components I2a, Q2a.

At 1204, a first cosine function generated using the cosine cordic 622 of synthesizer 604 is applied to the first in-phase component I1 using the multiplier 1048 in FIG. 10 or the multiplier 1148 in FIG. 11 to generate a first offset in-phase component, e.g., $I1*\cos(\theta 1)$ of equation (2). At 1206, a first sine function generated using the sine cordic 620 of synthesizer 604 is applied to the first quadrature component Q1 using the multiplier 1054 in FIG. 10 or the multiplier 1154 in FIG. 11 to generate a first offset quadrature component $Q1*\sin(\theta 1)$ of equation (2). At 1208, a second cosine function generated using the cosine cordic 622 is applied to the second in-phase component I2 using the multiplier 1040 in FIG. 10 and or multiplier 1140 in FIG. 11 to generate a second offset in-phase component, e.g., $I2*\cos(\theta 2)$ of equation (3). At 1210, a second sine function generated using the sine cordic 620 of synthesizer 604 is applied to the second quadrature component Q2 using the multiplier 1046 in FIG. 10 or the multiplier 1146 in FIG. 11 to generate a second offset quadrature component, e.g., $Q2*\sin(\theta 2)$ of equation (2).

At 1212, the first sine function generated using the sine cordic 620 of synthesizer 604 is applied to the first in-phase component I1 using the multiplier 1050 in FIG. 10 or the multiplier 1150 in FIG. 11 to generate a third offset in-phase component, e.g., $I1*\sin(\theta 1)$ of equation (2). At 1214, first cosine function generated using the cosine cordic 622 of synthesizer 604 is applied to the first quadrature component Q1 using the multiplier 1052 in FIG. 10 or the multiplier 1152 in FIG. 11 to generate a third offset quadrature component e.g., Q1*cos(θ1) of equation (2). At 1216, the second sine function generated using the sine cordic 620 is applied to the second in-phase component I2 using the multiplier 1042 in FIG. 10 or multiplier 1142 in FIG. 11 to generate a fourth offset in-phase component, e.g., I2*sin(θ2) of equation (2). At 1218, the second cosine function generated using the cosine cordic 622 of synthesizer 604 is applied to the second quadrature component Q2 using the multiplier 1044 in FIG. 10 or the multiplier 1144 in FIG. 11 to generate a fourth offset quadrature component, e.g., Q2*cos(θ2) of equation (2).

At 1220, adders 1010, 1014 of FIG. 10 or 1110, 1114, and 1118 of FIG. 11 sum the first offset in-phase component I1*cos(θ1), the first offset quadrature component Q1*sin(θ1), the second offset in-phase component I2*cos(θ2), and the second offset quadrature component Q2*sin(θ2), to generate the composite in-phase component Ic of the composite baseband signal. More particularly, with respect to FIG. 10, the adder 1010, receives terms I1*cos(θ1), Q1*sin(θ1) and outputs the result to adder 1014, which sums the result with the terms I2*cos(θ2), Q2*sin(θ2), which generates the composite in-phase component Ic. With respect to FIG. 11, the adder 1110 receives the terms I1*cos(θ1), Q1*sin(θ1) and outputs first partial composite in-phase component I2a. The adder 1114 receives the terms I2*cos(θ2), Q2*sin(θ2) and outputs second partial composite in-phase component I2a. The adder 118 sums the first partial composite in-phase component I1a and second partial composite in-phase component Ia2 to generate the in-phase composite component Ic.

At 1222, adders 1012, 1016 of FIG. 10 or 1112, 1116 and 1120 of FIG. 11 sum the third offset in-phase component I1*sin(θ1), the third offset quadrature component Q1*cos(θ1), the fourth offset in-phase component I2*sin(θ2), and the fourth offset quadrature component Q2*cos(θ2), to generate the composite quadrature component Qc of the composite baseband signal. More particularly, with respect to FIG. 10, the adder 1012, receives terms I1*sin(θ1), Q1*cos(θ1) and outputs the result to adder 1016, which sums the result with the terms I2*sin(θ2), Q2*cos(θ2), which generates the composite quadrature component Qc. With respect to FIG. 11, the adder 1112 receives the terms I1*sin(θ1), Q1*cos(θ1) and outputs first partial composite quadrature component Q1a. The adder 1116 receives the terms I2*sin(θ2), Q2*cos(θ2) and outputs second partial composite quadrature component Q2a. The adder 1120 sums the first partial composite quadrature component Q1a and second partial composite quadrature component Qa2 to generate the composite quadrature component Qc.

At 1224, magnitude-phase cordic 236 receives the composite in-phase component Ic and the composite quadrature component Qc and generates the composite envelope signal, for example, as described above by reference to 404 of FIG. 4.

Figure 13:
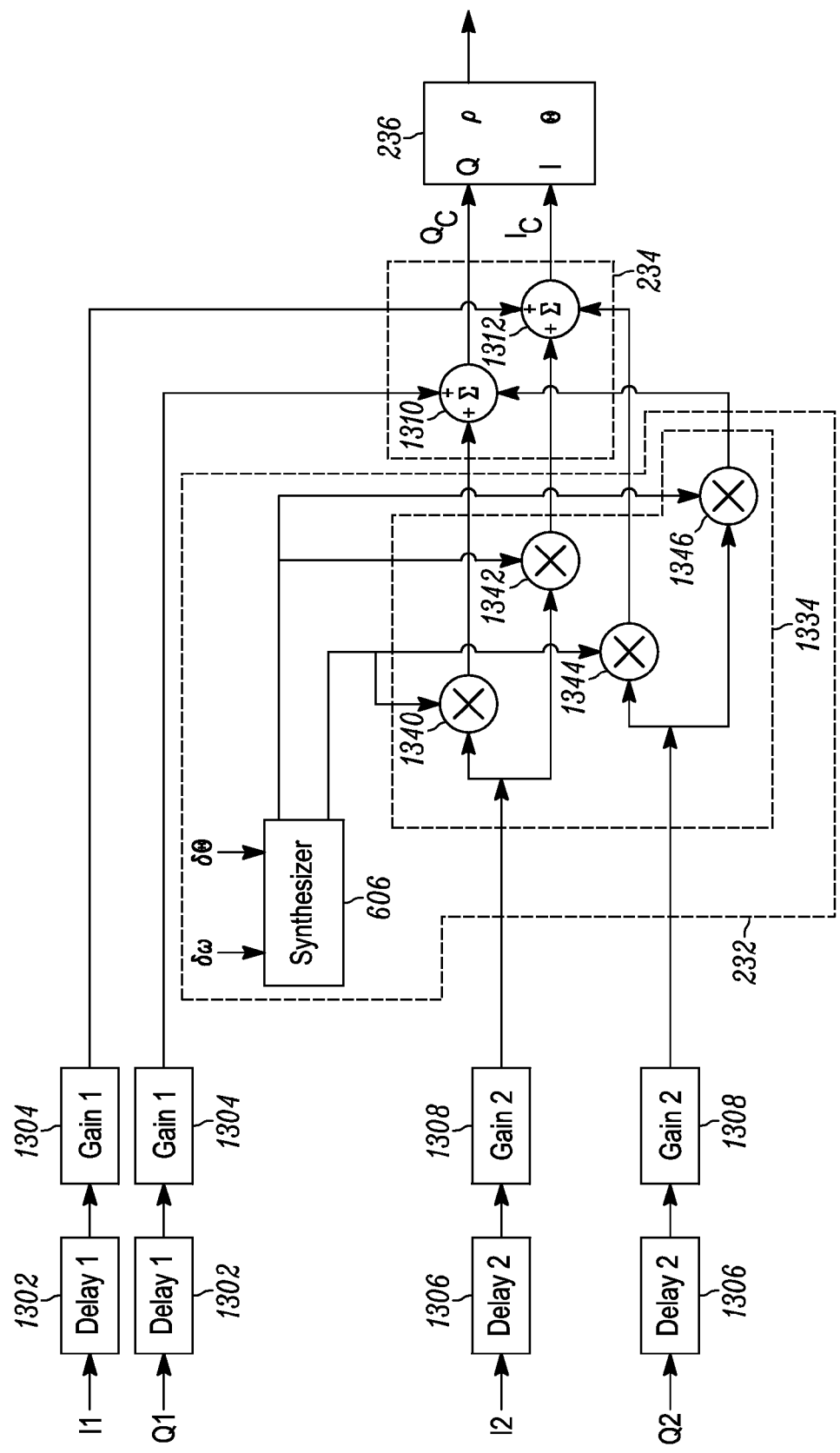
FIG. 13 is a block diagram illustrating one example of an envelope tracking controller in accordance with the present teachings.

Turning now to FIG. 13, shown therein is one example of an ET controller with an internal complex mixer and synthesizer, for example ET controller 208, for generating a composite envelope signal in accordance with the present teachings. The ET controller 208, in one embodiment includes: first delays 1302; first gains 1304; second delays 1306; second gains 1308; the complex mixer and synthesizer 232 comprising a plurality of multipliers 1340, 1342, 1344, and 1346 and the synthesizer 606; the summer 234 comprising summers 1310 and 1312; and the magnitude-phase cordic 236. The multipliers 1340, 1342, 1344, and 1346 implement the complex mixer 1334.

The following equation (3) is one mathematical representation of an implementation of the ET controller 208, which is shown in FIG. 13.

$$Env=[(I1+I2*\cos(\delta\omega*t+\delta\theta)-Q2*\cos(\delta\omega*t+\delta\theta-\Pi/2))^2+(Q1+Q2*\cos(\delta\omega*t+\delta\theta)+I2*\cos(\delta\omega*t+\delta\theta-\Pi/2))^2]^{1/2} \quad (3)$$

In one example embodiment, the synthesizer 606 is configured to receive at least one offset characteristic comprised of at least one of a phase offset and a frequency offset, respectively, represented by the symbols δω and δθ in FIG. 13. The synthesizer 606 operates with the multipliers 1340, 1342, 1344, and 1346 to combine the offset characteristics into the in-phase and quadrature components of one or more baseband signals to generate the plurality of offset components comprising the offset in-phase components and the offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one of more AFC offsets, such as the AFC1 and the AFC2. In cases where the first and second baseband signals are transmitted to different base stations, the AFC offset is used in facilitating fidelity of the two signals that are transmitted to the two different base stations.

The adder 1312 combines a first subset of the plurality offset components within a sum of the in-phase components of the plurality of baseband signals to generate a composite in-phase component Ic. The summer 1310 combines a second subset of the plurality offset components within a sum of the quadrature components of the plurality of baseband signals to generate a composite quadrature component Qc. The magnitude-phase cordic 236 uses Ic and Qc to generate the composite envelope signal.

Figure 14:
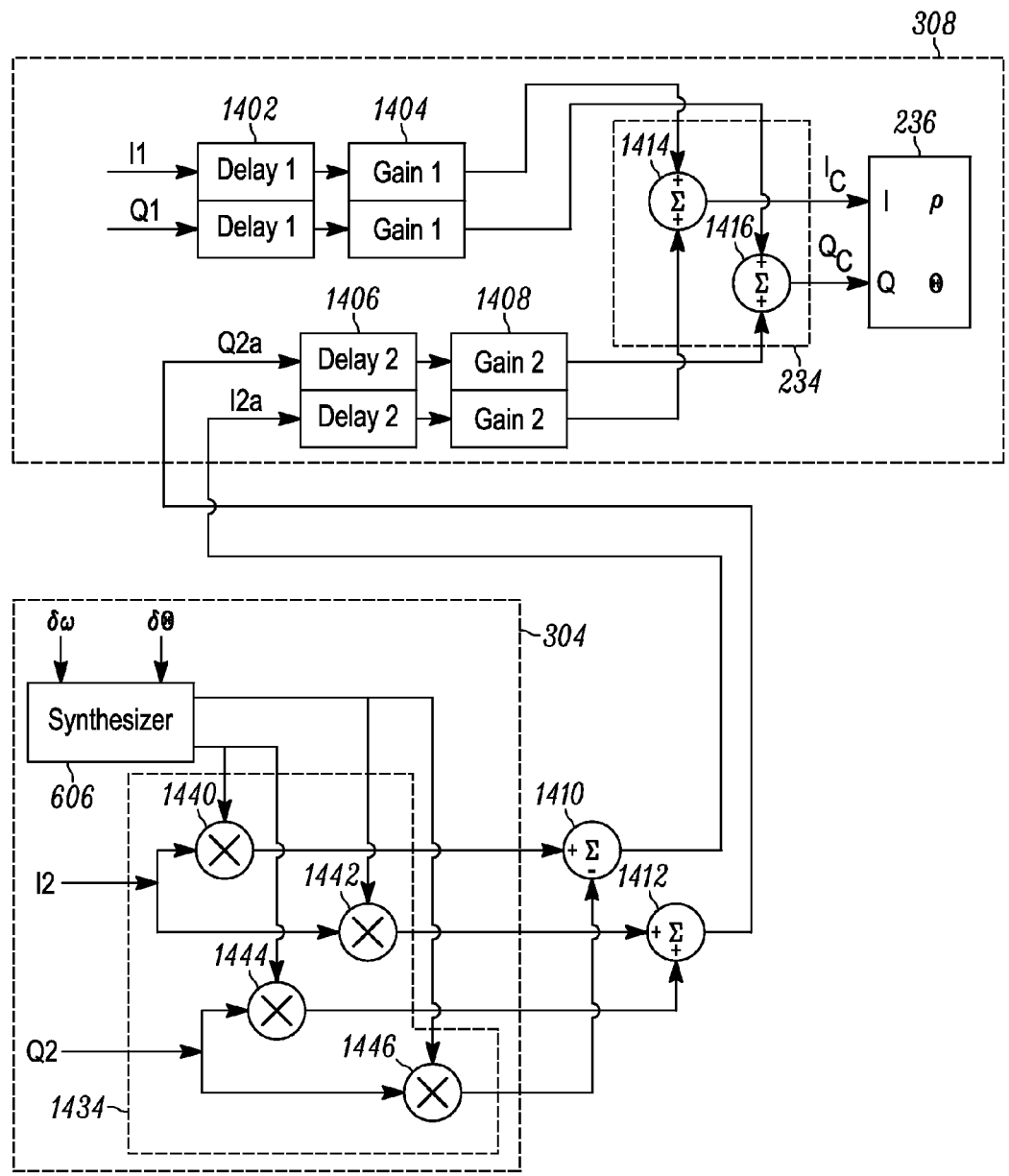
FIG. 14 is a block diagram illustrating one example of an envelope tracking controller and complex mixer and synthesizer in accordance with the present teachings.

Turning now to FIG. 14, shown therein is one example of an ET controller, for example ET controller 308, for generating a composite envelope signal in accordance with the present teachings. The ET controller 308, in one embodiment includes: first delays 1402; first gains 1404; second delays 1406; second gains 1408; the complex mixer and synthesizer 304 comprising a plurality of multipliers 1440, 1442, 1444, and 1446 and the synthesizer 606; the summer 234 comprising adders 1414 and 1416; and the magnitude-phase cordic 236. The multipliers 1440, 1442, 1444, and 1446 implement the complex mixer 1434.

The complex mixer and synthesizer 304, in one embodiment, is coupled to outputs of the second digital modulator 212. In one example embodiment, complex mixer and synthesizer 304 is configured to receive baseband signal components I2 and Q2 which are the I and Q components of the second baseband signal. In one embodiment, the RFIC 106 includes complex mixer and synthesizer 302 coupled to an output of the first digital modulator. Complex mixer and synthesizer 302 passes through the I and Q signals of the first digital modulator 210 to the ET controller 308. In another embodiment, the ET controller 308 samples I and Q signals from signal lines coupled to the first digital modulator 210 without an intervening complex mixer and synthesizer coupled to the first digital modulator 210.

In one embodiment, the ET controller 308 is configured to receive I1, Q1 baseband signal components and complex mixer and synthesizer 304 is configured to receive I2 and Q2 baseband signal components. The delays 1402, 1406, in one example, compensate for amplifier gain, signal offset, RF signal delay, power amplifier characteristics, base station requested timing advances or delay, and/or associated RFIC 106 component temperatures. The ET controller 308 adjusts the gains 1404, 1408 to compensate for signal drive levels.

In one example embodiment, the synthesizer 606 is configured to receive at least one offset characteristic comprised of at least one of a phase offset and a frequency offset, respectively, represented by the symbols δω and δθ in FIG. 14. The synthesizer 606 operates with the multipliers 1440, 1442, 1444, and 1446 to combine offset characteristics into the in-phase and quadrature components of one or more baseband signals to generate the plurality of partial offset components comprising the partial offset in-phase components and the partial offset quadrature components. The phase offset, in one example implementation, is a phase offset difference between the first and second baseband signals; and the frequency offset comprises a difference in carrier frequency between the carrier signals onto which the baseband signals are modulated.

In at least one implementation scenario, at least one offset component comprises a first frequency offset component caused by transmitting a first transmit signal of the plurality of transmit signals to a first base station, e.g., 108, and transmitting a second transmit signal of the plurality of transmit signals to a second base station, e.g., 110. In such a case, the at least one offset characteristic further comprises an AFC offset, and the frequency offset further incorporates one of more AFC offsets, such as the AFC1 and the AFC2. In cases where the first and second baseband signals are transmitted to different base stations, the AFC offset is used in facilitating fidelity of the two signals that are transmitted to the two different base stations.

The adder 1414 combines a first partial composite in-phase component within a sum of the in-phase components of the plurality of baseband signals to generate a composite in-phase component Ic. The summer 1416 combines a partial composite quadrature component within a sum of the quadrature components of the plurality of baseband signals to generate a composite quadrature component Qc. The magnitude-phase cordic 236 uses Ic and Qc to generate the composite envelope signal.

Figure 15:
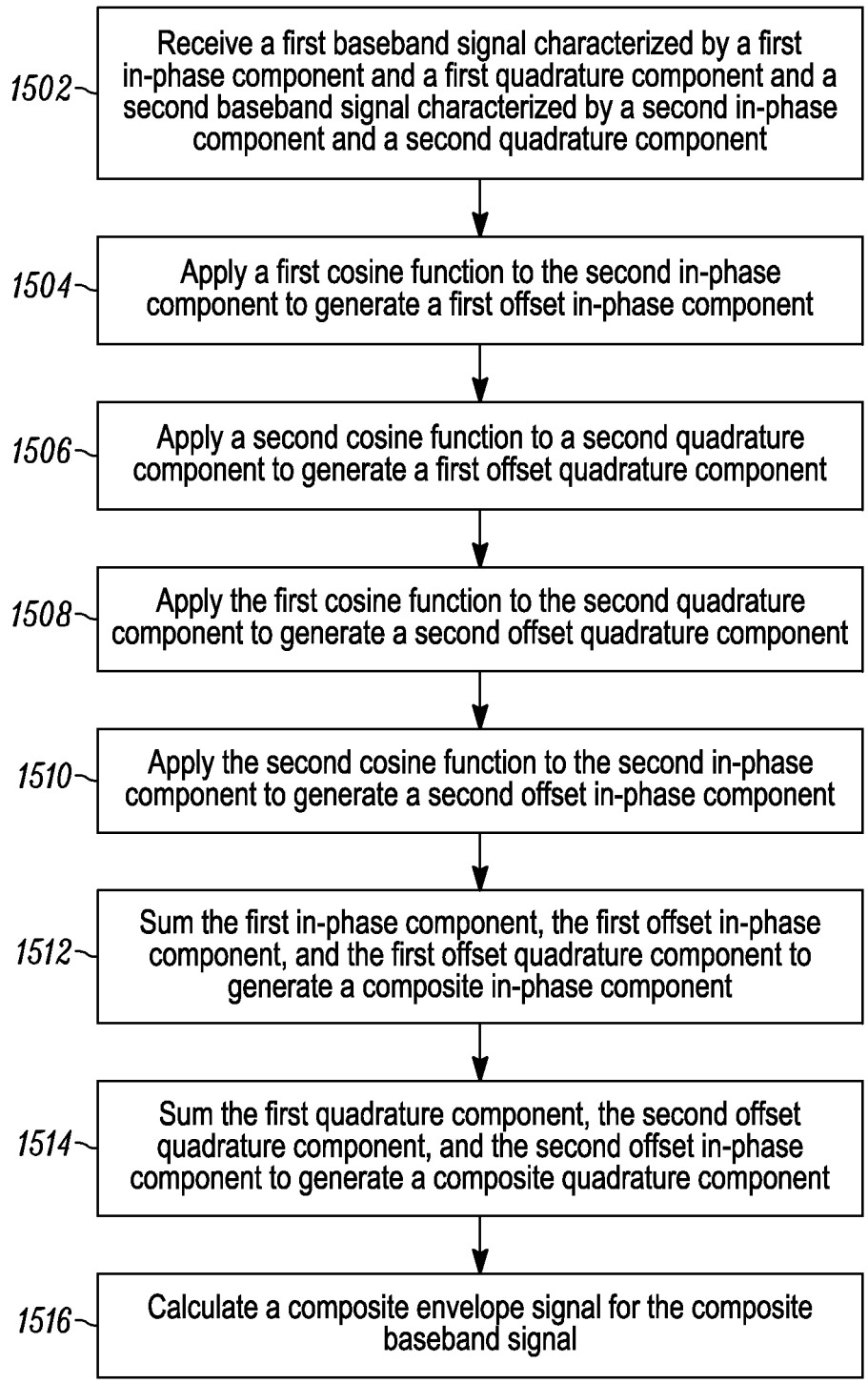
FIG. 15 is a logical flow chart illustrating a method for calculating the composite envelope signal in accordance with the present teachings.

Turning now to FIG. 15, which shows a logical flow chart illustrating a method 1500 for generating a composite envelope signal. The method 1500 is described in conjunction with the circuits shown in FIG. 13 and FIG. 14.

The method 1500 includes applying a sinusoidal function to the at least one baseband signal within the plurality of baseband signals, which comprises, at 1502, a first baseband signal characterized by a first in-phase component I1 and a first quadrature component Q1 and a second baseband signal characterized by a second in-phase component I2 and a second quadrature component Q2 is received. In FIG. 13, the delay and gains 1302, 1304, receive and process I1, Q1, and the delay and gains 1306, 1308, receive and process I2, Q2. In FIG. 14, the delay and gains 1402, 1404, receive and process I1, Q1, and the delay and gains 1406, 1408, receive and process I2, Q2.

At 1504, a cosine function generated using the cosine cordic 632 of synthesizer 606 is applied to the second in-phase component I2 using the multiplier 1340 in FIG. 13 or the multiplier 1440 in FIG. 14 to generate a first offset in-phase component, e.g., I2*cos(δω*t+δθ) of equation (3). At 1506, a cosine function generated using the cosine cordic 630 of synthesizer 606 is applied to the second quadrature component Q2 using the multiplier 1342 in FIG. 13 or the multiplier 1442 in FIG. 14 to generate a first offset quadrature component Q2*cos(δω*t+δθ−Π/2) of equation (3). At 1508, the cosine function generated using the cosine cordic 632 is applied to the second quadrature component Q2 using the multiplier 1344 in FIG. 13 and or multiplier 1444 in FIG. 14 to generate a second offset quadrature component, e.g., Q2*cos(δω*t+δθ) of equation (3). At 1510, a cosine function generated using the cosine cordic 630 of synthesizer 606 is applied to the second in-phase component I2 using the multiplier 1342 in FIG. 13 or the multiplier 1442 in FIG. 14 to generate a second offset in-phase component, e.g., I2*cos(δω*t+δθ−Π/2) of equation (3).

At 1512, the adder 1312 of FIG. 13 or 1410 and 1414 of FIG. 8 sum the first in-phase component I1, the first offset in-phase component I2*cos(δω*t+δθ), and the first offset quadrature component, Q2*cos(δω*t+δθ−Π/2) to generate the composite in-phase component Ic of the composite baseband signal. More particularly, with respect to FIG. 14, the adder 1410, receives terms I2*cos(δω*t+δθ), Q2*cos (δω*t+δθ−Π/2) and outputs partial composite in-phase component I2a which is combined with I1 at adder 1414 to generate the composite in-phase component.

At 1514, the adder 1310 of FIG. 13 or 1412 and 1416 of FIG. 14 sum the first quadrature component Q1, the second offset quadrature component Q2*cos(δω*t+δθ), and the second offset in-phase component, I2*cos(δω*t+δθ−Π/2) to generate the composite quadrature component Qc of the composite baseband signal. More particularly, with respect to FIG. 14, the adder 1412, receives terms Q2*cos(δω*t+δθ), I2*cos(δω*t+δθ−Π/2) and outputs partial composite quadrature component Q2a which is combined with the first quadrature component Q1 at adder 1416 to generate the composite in-phase component.

At 1516, magnitude-phase cordic 236 receives the composite in-phase component Ic and the composite quadrature component Ic and generates the composite envelope signal, for example, as described above by reference to 404 of FIG. 4.

Figure 16:
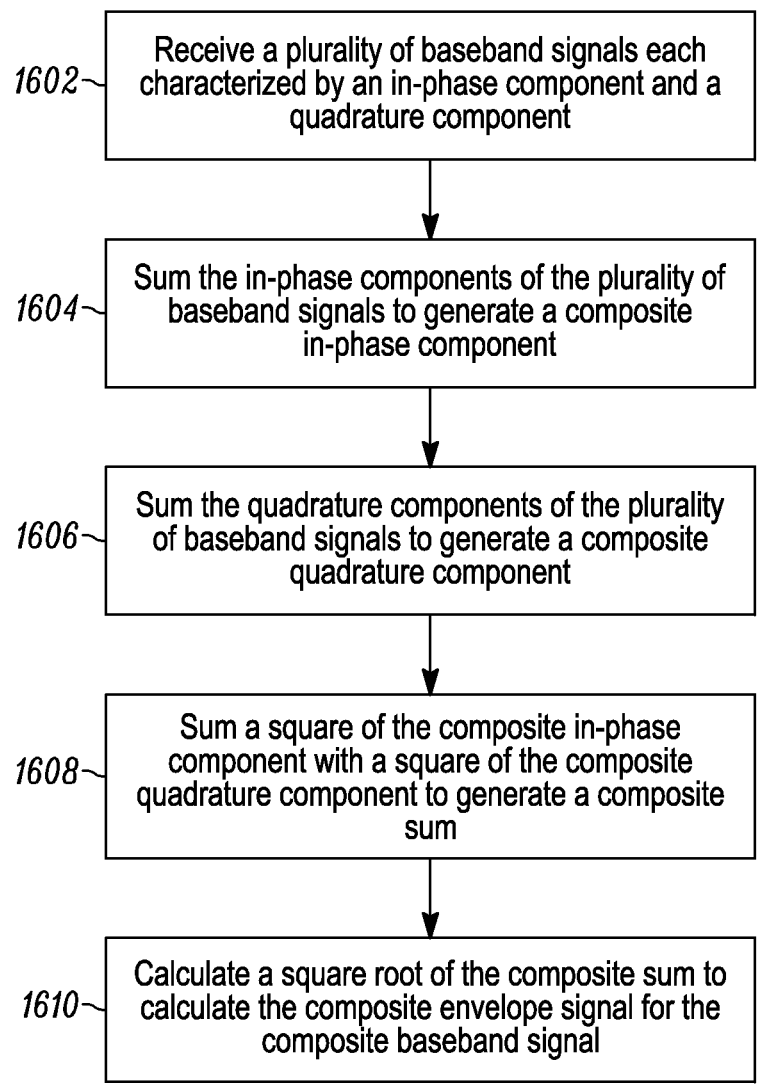
FIG. 16 is a block diagram illustrating a method for calculating the composite envelope signal in accordance with the present teachings.

Turning now to FIG. 16, which depicts one example of a method 1600 for generating a composite envelope signal in accordance with the present teachings. The RFIC 106, in one example performs the method 1600.

At 1602, a plurality of baseband signals each characterized by an in-phase component and a quadrature component are received. In one example the complex mixer and synthesizer 232 of FIG. 2 receives the in-phase and quadrature components. In another example, the complex mixer and synthesizers 302, 304 receives the components.

At 1604, the in-phase components of the plurality of baseband signals are summed to generate a composite in-phase component. At 1606, the quadrature components of the plurality of baseband signals are summed to generate a composite quadrature component. In one example, the complex mixer and synthesizer 232 and summer 234 performs the summing of steps 1602, 1604. In another example, the complex mixer and synthesizers 302, 304 and summer 234 performs the summing of steps 1602, 1604.

At 1608, in one example, the magnitude-phase cordic 236 sums a square of the composite in-phase component Ic with a square of the composite quadrature component Qc to generate a composite sum. At 1610, in one example, the magnitude-phase cordic 236 calculates a square root of the composite sum to calculate the composite envelope signal for the composite baseband signal, for instance as described above by reference to block 404 of FIG. 4.

Figure 17:
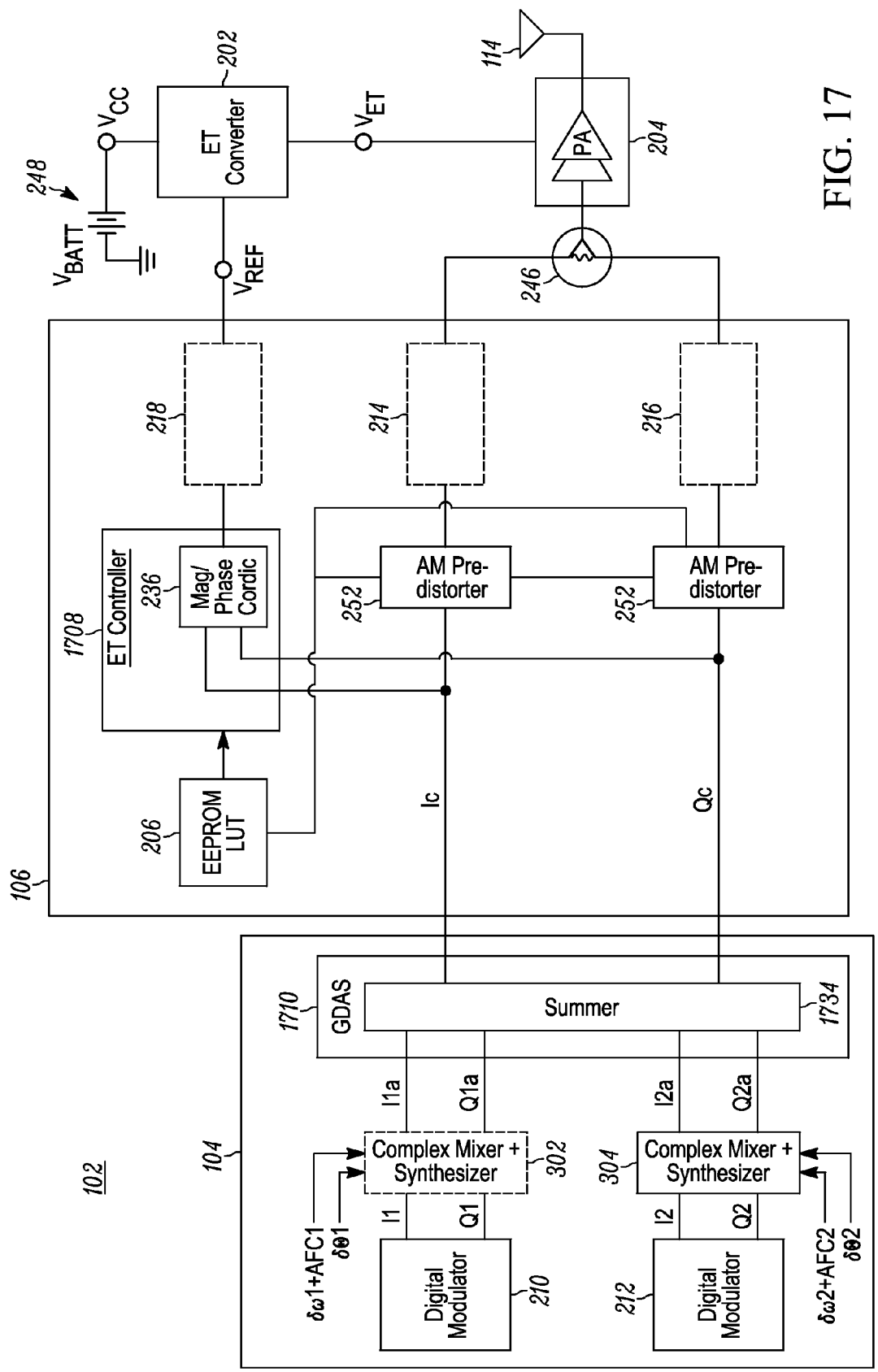
FIG. 17 is an example of a communication device in accordance with the present teachings.

Turning now to FIG. 17, which depicts one embodiment of a communication device, e.g., the communication device 102 of FIG. 1, in accordance with the current teachings. The embodiment depicted in FIG. 17 includes many of the same components configured in a substantially similar manner as components of FIG. 2 and FIG. 3. Thus, a redundant description of similar components is not presented. Some differences between FIG. 17 and FIGS. 2 and 3 include that, in one embodiment, the baseband IC 104 of FIG. 17 includes the first and second digital modulators 210, 212, and the complex mixers and synthesizers 302, 304. Further, the baseband IC 104 includes a gain-delay adjust and summer (GDAS) 1710. The GDAS 1710 further includes a summer 1734. The first and second complex mixers and synthesizers 302, 304 are configured and operate in a substantially similar manner to the first and second complex mixers and synthesizers 302, 304 illustrated in FIGS. 2 and 3.

Figure 18:
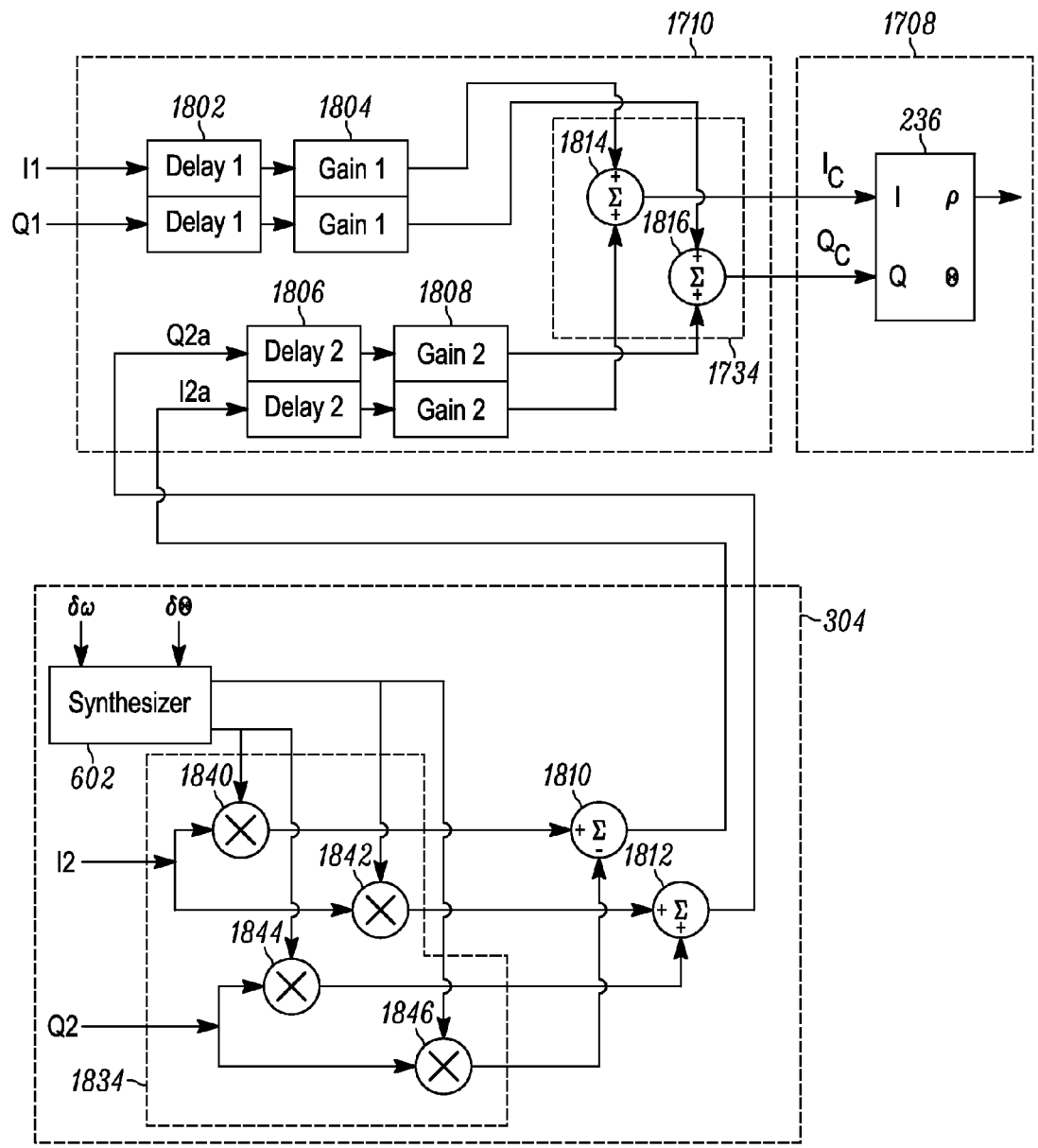
FIG. 18 is a block diagram illustrating one example of an envelope tracking controller, complex mixer and synthesizer, and a gain-delay adjust and summer in accordance with the present teachings.

Turning now to FIG. 18, shown therein is one example of an ET controller, complex mixer and synthesizer, and GDAS, configured to generate a composite envelope signal in accordance with the present teachings. FIG. 18, for example, shows ET controller 1708, complex mixer and synthesizer 304 and GDAS 1710, configured to generate a composite envelope signal. The complex mixer and synthesizer 304 of FIG. 18 is configured and functions in a substantially similar manner to the complex mixer and synthesizer 304 of FIG. 8, thus redundant descriptions are omitted. The complex mixer and synthesizer 304 of FIG. 18 receives baseband components I2 and Q2, and outputs corresponding partial composite in-phase and quadrature components I2a, Q2a in a substantially similar manner as the complex mixer and synthesizer 304 of FIG. 8. The GDAS 1710 of FIG. 18 receives baseband components I1 and Q1, and the partial composite in-phase and partial composite quadrature components I2a, Q2a. The GDAS 1710 operates in a manner similar to the ET controller 308 depicted in FIG. 8, however, the GDAS 1710 does not include the cordic 236. First delays 1802 and first gains 1804 process the baseband components I1 and Q1 in a substantially similar manner to the first delays 802 and first gains 804 of FIG. 8. Further, the second delays 1806 and second gains 1808 process the partial composite in-phase and quadrature components I2a, Q2a in a substantially similar manner to the second delays 806 and second gains 806 of FIG. 8. Further, the adders 1814 and 1816 of the summer 1734 of FIG. 18 operate in a substantially similar manner to the adders 814 and 816 of the summer 234 of FIG. 8. Thus, the summer 1734 outputs composite in-phase component Ic and composite quadrature component Qc corresponding to the result of combining the in-phase component I1 and the partial composite in-phase component I1a, and the quadrature component Q1 and the partial composite quadrature component Q2a. The cordic 236 of the ET controller 1708 generates the composite envelope signal from the composite in-phase component Ic and the composite quadrature component Qc.

Figure 19:
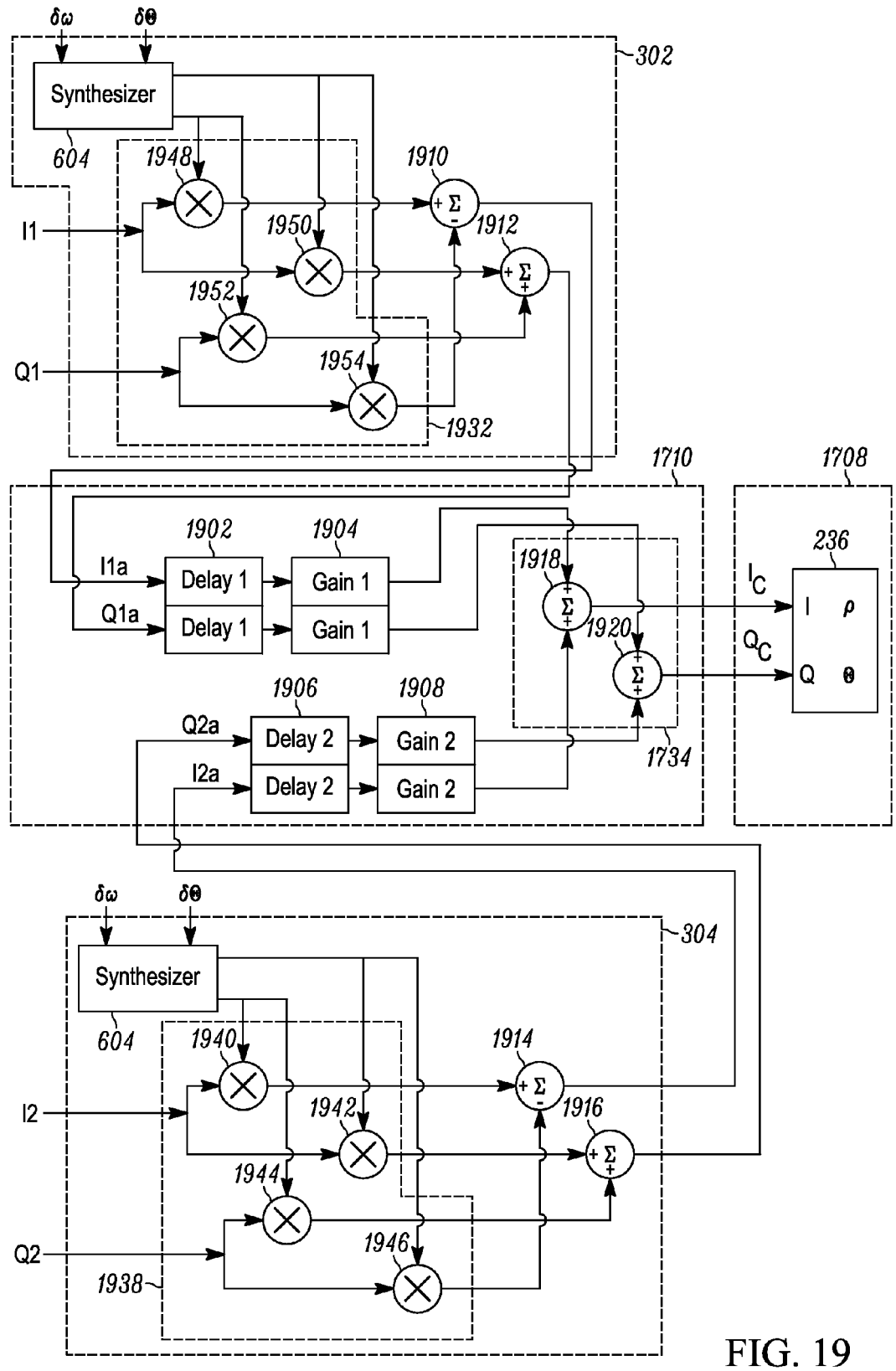
FIG. 19 is a block diagram illustrating one example of an envelope tracking controller, complex mixer and synthesizer, and a gain-delay adjust and summer in accordance with the present teachings.

Turning now to FIG. 19, shown therein is one example of an ET controller, a complex mixer and a GDAS, for generating a composite envelope signal in accordance with the present teachings. FIG. 19, for example, depicts ET controller 1708, complex mixer and synthesizers 302, 304 and GDAS 1710, for generating a composite envelope signal. The complex mixer and synthesizers 302, 304 of FIG. 19 are configured and function in a substantially similar manner to the complex mixer and synthesizers 302 and 304 of FIG. 11, thus redundant descriptions are omitted. The complex mixer and synthesizer 302 of FIG. 19 receives baseband components I1 and Q1, and outputs corresponding partial composite in-phase and quadrature components I1a, Q1a in a substantially similar manner as the complex mixer and synthesizer 302 of FIG. 11. The complex mixer and synthesizer 304 of FIG. 19 receives baseband components I2 and Q2, and outputs corresponding partial composite in-phase and quadrature components I2a, Q2a in a substantially similar manner as the complex mixer and synthesizer 304 of FIG. 11. The GDAS 1710 of FIG. 19 receives partial composite in-phase and quadrature components I1a, Q1a, I2a, Q2a. The GDAS 1710 operates in a manner similar to the ET controller 308 depicted in FIG. 11, however, the GDAS 1710 does not include the cordic 236. Thus, first delays 1902 and first gains 1904 process the partial composite in-phase component I1a and the partial composite quadrature component Q1a in a substantially similar manner to the first delays 1102 and first gains 1104 of FIG. 11. Further, the second delays 1906 and second gains 1908 process the partial composite in-phase component I2a and partial composite quadrature component Q2a in a substantially similar manner as the second delays 1106 and second gains 1108 of FIG. 11. Further, the adders 1918 and 1920 of the summer 1734 of FIG. 19 operates in a substantially similar manner to the adders 1118 and 1120 of the summer 234 of FIG. 11. Thus, the summer 1734 outputs composite in-phase component Ic and composite quadrature component Qc corresponding to the result of combining the partial composite in-phase component I1a and the partial composite in-phase component I2a, and the partial composite quadrature component Q1a and the partial composite quadrature component Q2a. The cordic 236 of the ET controller 1708 generates the composite envelope signal from the composite in-phase component Ic and the composite quadrature component Qc.

Figure 20:
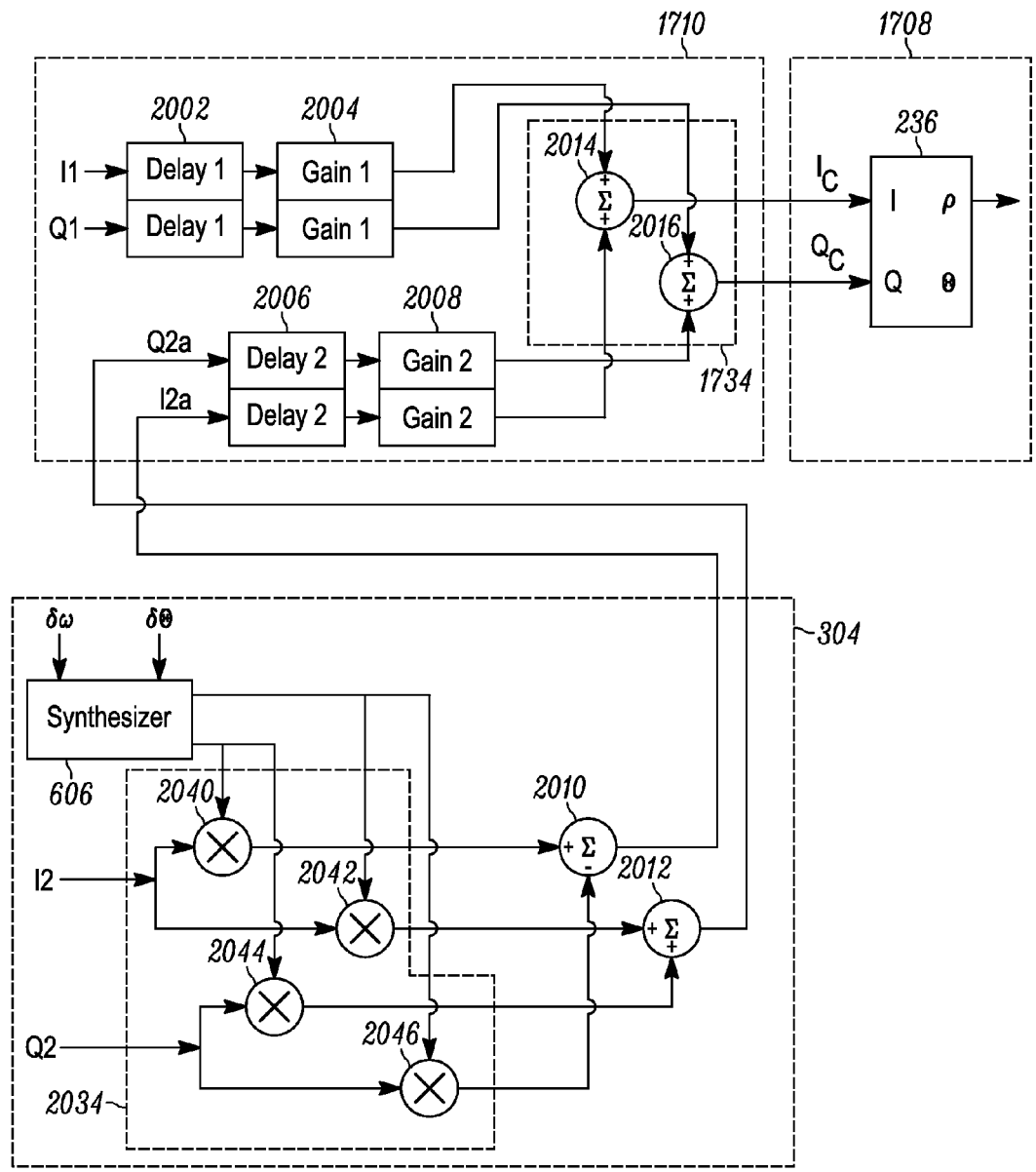
FIG. 20 is a block diagram illustrating one example of an envelope tracking controller, complex mixer and synthesizer, and a gain-delay adjust and summer in accordance with the present teachings.

Turning now to FIG. 20, shown therein is one example of an ET controller, a complex mixer and synthesizer, and a GDAS, for generating a composite envelope signal in accordance with the present teachings. FIG. 20, for example, depicts ET controller 1708, complex mixer and synthesizer 304 and GDAS 1710, for generating a composite envelope signal. The complex mixer and synthesizer 304 of FIG. 20 is configured and functions in a substantially similar manner to the complex mixer and synthesizer 304 of FIG. 14, thus redundant descriptions are omitted. The complex mixer and synthesizer 304 of FIG. 20 receives baseband components I2 and Q2, and outputs corresponding partial composite in-phase and quadrature components I2a, Q2a in a substantially similar manner as the complex mixer and synthesizer 304 of FIG. 14. The GDAS 1710 of FIG. 20 receives baseband components I1 and Q1, and the partial composite in-phase and quadrature components I2a, Q2a. The GDAS 1710 operates in a manner similar to the ET controller 308 depicted in FIG. 14, however, the GDAS 1710 does not include the cordic 236. Thus, first delays 2002 and first gains 2004 process the baseband components I1 and Q1 in a substantially similar manner to the first delays 1402 and first gains 1404 of FIG. 14. Further, the second delays 2006 and second gains 2008 process the partial composite in-phase and quadrature components I2a, Q2a in a substantially similar manner as the second delays 1406 and second gains 1408 of FIG. 14. Further, the adders 2014 and 2016 of the summer 1734 of FIG. 20 operates in a substantially similar manner to the adders 1414 and 1416 of the summer 234 of FIG. 14. Thus, the summer 1734 outputs composite in-phase component Ic and composite quadrature component Qc corresponding to the result of combining the first in-phase component I1 and the partial composite in-phase component I1a, and the first quadrature component Q1 and the partial composite quadrature component Q2a. The cordic 236 of the ET controller 1708 generates the composite envelope signal from the composite in-phase component Ic and the composite quadrature component Qc.

Disclosed in one embodiment is an apparatus for generating a composite envelope signal for a plurality of transmit signals, the apparatus comprising: at least one complex mixer and synthesizer configured to generate a plurality of offset components based on at least one offset characteristic between baseband signals in a plurality of baseband signals that represent a corresponding plurality of different transmit signals, wherein the at least one offset characteristic comprises at least one of a frequency offset, a phase offset or an amplitude offset; a set of summer circuits coupled to the at least one complex mixer and synthesizer. The set of summer circuit are configured, in one embodiment, to combine a first subset of the plurality of offset components within a sum of the in-phase components of the plurality of baseband signals to generate a composite in-phase component, combine a second subset of the plurality of offset components within a sum of the quadrature components of the plurality of baseband signals to generate a composite quadrature component. The apparatus also comprises an envelope tracking controller coupled to the set of summer circuits and configured to calculate a composite envelope signal for the composite baseband signal, wherein the composite envelope signal is used to generate a composite envelope reference voltage for powering a single power amplifier as the power amplifier transmits the plurality of different transmit signals.

The envelope tracking controller, in one embodiment, is included on a radio frequency integrated circuit, wherein at least a first summer circuit in the set of summer circuits is included within the envelope tracking controller.

The at least one complex mixer and synthesizer and the set of summer circuits is, in one embodiment, included within the envelope tracking controller.

The envelope tracking controller, in one embodiment, is included on a radio frequency integrated circuit, wherein the at least one complex mixer and synthesizer is included on the radio frequency integrated circuit external to the envelope tracking controller.

The envelope tracking controller, in one embodiment, is included on a radio frequency integrated circuit, wherein the at least one complex mixer and synthesizer is included on a second integrated circuit that is external to the radio frequency integrated circuit.

The at least one complex mixer and synthesizer, in one embodiment, comprises: a synthesizer circuit configured to generate a sinusoidal function; and a plurality of combiners coupled to the synthesizer circuit to apply the sinusoidal function to at least one baseband signal within the plurality of baseband signals to generate the plurality of offset components.

The synthesizer circuit, in one embodiment, comprises at least one plurality of cordics comprising at least one of a cosine cordic or a sine cordic of; or a digital signal processor.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method, performed on an integrated circuit, for generating a composite envelope reference voltage for a plurality of transmit signals, the method comprising:
generating a composite baseband signal from a plurality of baseband signals that represent a corresponding plurality of different transmit signals;
calculating a composite envelope signal for the composite baseband signal; and
generating a composite envelope reference voltage from the composite envelope signal for use in powering a single power amplifier as the power amplifier transmits the plurality of different transmit signals;
wherein each baseband signal in the plurality of baseband signals is characterized by an in-phase component and a quadrature component, wherein generating the composite baseband signal from the plurality of baseband signals comprises:
generating a plurality of offset components based on at least one offset characteristic between the baseband signals in the plurality of baseband signals, wherein the at least one offset characteristic comprises at least one of a frequency offset, a phase offset or an amplitude offset and further comprises an automatic frequency control offset;
combining a first subset of the plurality of offset components within a sum of the in-phase components of the plurality of baseband signals to generate a composite in-phase component; and
combining a second subset of the plurality of offset components within a sum of the quadrature components of the plurality of baseband signals to generate a composite quadrature component.

2. A method, performed on an integrated circuit, for generating a composite envelope reference voltage for a plurality of transmit signals, the method comprising:
generating a composite baseband signal from a plurality of baseband signals that represent a corresponding plurality of different transmit signals;
calculating a composite envelope signal for the composite baseband signal; and
generating a composite envelope reference voltage from the composite envelope signal for use in powering a single power amplifier as the power amplifier transmits the plurality of different transmit signals;
wherein each baseband signal in the plurality of baseband signals is characterized by an in-phase component and a quadrature component, wherein generating the composite baseband signal from the plurality of baseband signals comprises:
generating a plurality of offset components based on at least one offset characteristic between the baseband signals in the plurality of baseband signals, wherein the at least one offset characteristic comprises a first frequency offset component caused by transmitting a first transmit signal of the plurality of transmit signals to a first base station and transmitting a second transmit signal of the plurality of transmit signals to a second base station;
combining a first subset of the plurality of offset components within a sum of the in-phase components of the plurality of baseband signals to generate a composite in-phase component; and
combining a second subset of the plurality of offset components within a sum of the quadrature components of the plurality of baseband signals to generate a composite quadrature component.

3. A method, performed on an integrated circuit, for generating a composite envelope reference voltage for a plurality of transmit signals, the method comprising:
generating a composite baseband signal from a plurality of baseband signals that represent a corresponding plurality of different transmit signals;
calculating a composite envelope signal for the composite baseband signal; and
generating a composite envelope reference voltage from the composite envelope signal for use in powering a single power amplifier as the power amplifier transmits the plurality of different transmit signals;
wherein each baseband signal in the plurality of baseband signals is characterized by an in-phase component and a quadrature component, wherein generating the composite baseband signal from the plurality of baseband signals comprises:
generating a plurality of offset components based on at least one offset characteristic between the baseband signals in the plurality of baseband signals, wherein the at least one offset characteristic comprises at least one of a frequency offset, a phase offset or an amplitude offset and generating the plurality of offset components comprises applying a sinusoidal function to at least one baseband signal within the plurality of baseband signals;
combining a first subset of the plurality of offset components within a sum of the in-phase components of the plurality of baseband signals to generate a composite in-phase component; and
combining a second subset of the plurality of offset components within a sum of the quadrature components of the plurality of baseband signals to generate a composite quadrature component.

4. The method of claim 3, wherein the plurality of baseband signals comprises a first baseband signal characterized by a first in-phase component and a first quadrature component and a second baseband signal characterized by a second in-phase component and a second quadrature component, wherein:
applying the sinusoidal function to the at least one baseband signal within the plurality of baseband signals comprising:

applying a cosine function to the second in-phase component to generate a first offset in-phase component;

applying a sine function to the second quadrature component to generate a first offset quadrature component;

applying the cosine function to the second quadrature component to generate a second offset quadrature component;

applying the sine function to the second in-phase component to generate a second offset in-phase component;

combining the first subset of the plurality of offset components within the sum of the in-phase components of the plurality of baseband signals to generate the composite in-phase component comprises summing the first in-phase component, the first offset in-phase component, and the first offset quadrature component;

combining the second subset of the plurality of offset components within the sum of the quadrature components of the plurality of baseband signals to generate the composite quadrature component comprises summing the first quadrature component, the second offset quadrature component, and the second offset in-phase component.

5. The method of claim 3, wherein the plurality of baseband signals comprises a first baseband signal characterized by a first in-phase component and a first quadrature component and a second baseband signal characterized by a second in-phase component and a second quadrature component, wherein:

applying the sinusoidal function to the at least one baseband signal within the plurality of baseband signals comprising:

applying a first cosine function to the first in-phase component to generate a first offset in-phase component;

applying a first sine function to the first quadrature component to generate a first offset quadrature component;

applying a second cosine function to the second in-phase component to generate a second offset in-phase component;

applying the second sine function to the second quadrature component to generate a second offset quadrature component;

applying the first sine function to the first in-phase component to generate a third offset in-phase component;

applying the first cosine to the first quadrature component to generate a third offset quadrature component;

applying the second sine function to the second in-phase component to generate a fourth offset in-phase component;

applying the second cosine function to the second quadrature component to generate a fourth offset quadrature component;

combining the first subset of the plurality of offset components within the sum of the in-phase components of the plurality of baseband signals to generate the composite in-phase component comprises summing the first offset in-phase component, the first offset quadrature component, the second offset in-phase component, and the second offset quadrature component;

combining the second subset of the plurality of offset components within the sum of the quadrature components of the plurality of baseband signals to generate the composite quadrature component comprises summing the third offset in-phase component, the third offset quadrature component, the fourth offset in-phase component, and the fourth offset quadrature component.

6. The method of claim 3, wherein the plurality of baseband signals comprises a first baseband signal characterized by a first in-phase component and a first quadrature component and a second baseband signal characterized by a second in-phase component and a second quadrature component, wherein:

applying the sinusoidal function to the at least one baseband signal within the plurality of baseband signals comprising:

applying a first cosine function to the second in-phase component to generate a first offset in-phase component;

applying a second cosine function to the second quadrature component to generate a first offset quadrature component;

applying the first cosine function to the second quadrature component to generate a second offset quadrature component;

applying the second cosine function to the second in-phase component to generate a second offset in-phase component;

combining the first subset of the plurality of offset components within the sum of the in-phase components of the plurality of baseband signals to generate the composite in-phase component comprises summing the first in-phase component, the first offset in-phase component, and the first offset quadrature component;

combining the second subset of the plurality of offset components within the sum of the quadrature components of the plurality of baseband signals to generate the composite quadrature component comprises summing the first quadrature component, the second offset quadrature component, and the second offset in-phase component.

7. An apparatus for generating a composite envelope signal for a plurality of transmit signals, the apparatus comprising:

at least one complex mixer and synthesizer configured to generate a plurality of offset components based on at least one offset characteristic between baseband signals in a plurality of baseband signals that represent a corresponding plurality of different transmit signals, wherein the at least one offset characteristic comprises at least one of a frequency offset, a phase offset or an amplitude offset and the at least one complex mixer and synthesizer comprises a synthesizer circuit configured to generate a sinusoidal function and a plurality of combiners coupled to the synthesizer circuit to apply the sinusoidal function to at least one baseband signal within the plurality of baseband signals to generate the plurality of offset components;

a set of summer circuits coupled to the at least one complex mixer and synthesizer and configured to:

combine a first subset of the plurality of offset components within a sum of the in-phase components of the plurality of baseband signals to generate a composite in-phase component;

combine a second subset of the plurality of offset components within a sum of the quadrature components of the plurality of baseband signals to generate a composite quadrature component;

an envelope tracking controller coupled to the set of summer circuits and configured to calculate a composite envelope signal for the composite baseband signal, wherein the composite envelope signal is used to generate a composite envelope reference voltage for powering a single power amplifier as the power amplifier transmits the plurality of different transmit signals.

8. The apparatus of claim 7, wherein the envelope tracking controller is included on a radio frequency integrated circuit, wherein at least a first summer circuit in the set of summer circuits is included within the envelope tracking controller.

9. The apparatus of claim 8, wherein the at least one complex mixer and synthesizer and the set of summer circuits is included within the envelope tracking controller.

10. The apparatus of claim 7, wherein the envelope tracking controller is included on a radio frequency integrated circuit, wherein the at least one complex mixer and synthesizer is included on the radio frequency integrated circuit external to the envelope tracking controller.

11. The apparatus of claim 7, wherein the envelope tracking controller is included on a radio frequency integrated circuit, wherein the at least one complex mixer and synthesizer is included on a second integrated circuit that is external to the radio frequency integrated circuit.

12. The apparatus of claim 7, wherein the synthesizer circuit comprises at least one of:
a plurality of cordics comprising at least one of a cosine cordic or a sine cordic; or
a digital signal processor.

* * * * *